US010340934B1

(12) United States Patent
Rakuljic et al.

(10) Patent No.: US 10,340,934 B1
(45) Date of Patent: Jul. 2, 2019

(54) SIGNAL PATH LINEARIZATION

(71) Applicant: Analog Devices, Inc., Norwood, MA (US)

(72) Inventors: Nevena Rakuljic, San Diego, CA (US); Carroll C. Speir, Pleasant Garden, NC (US); Eric Otte, Boston, MA (US); Corey Petersen, Poway, CA (US); Jeffrey P. Bray, San Diego, CA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/845,796

(22) Filed: Dec. 18, 2017

(51) Int. Cl.
*H03M 1/10* (2006.01)
*H03M 1/12* (2006.01)

(52) U.S. Cl.
CPC ........ *H03M 1/1033* (2013.01); *H03M 1/1009* (2013.01); *H03M 1/1038* (2013.01); *H03M 1/1042* (2013.01); *H03M 1/12* (2013.01)

(58) Field of Classification Search
CPC .... H03M 1/12; H03M 1/1033; H03M 1/1038; H03M 1/1042; H03M 1/1009
USPC .................................................. 341/120, 155
See application file for complete search history.

(56) References Cited

U.S. PATENT DOCUMENTS

| | | | |
|---|---|---|---|
| 5,168,459 A | 12/1992 | Hiller | |
| 7,015,851 B1 | 3/2006 | Bruhns et al. | |
| 7,330,141 B2 * | 2/2008 | Temerinac | H03M 1/1042 341/120 |
| 8,063,811 B2 | 11/2011 | Hojabri et al. | |
| 8,410,960 B2 | 4/2013 | Hekstra et al. | |
| 8,644,437 B2 | 2/2014 | Kim et al. | |
| 8,723,707 B2 | 5/2014 | Ali | |
| 8,825,415 B2 * | 9/2014 | Johansson | H03M 1/0626 341/118 |
| 9,154,146 B1 | 10/2015 | Chiu et al. | |
| 9,461,660 B2 * | 10/2016 | Muhammad | H03M 1/0626 |
| 9,564,876 B2 | 2/2017 | Kim et al. | |
| 9,584,146 B2 * | 2/2017 | Op 't Eynde | H03M 1/1038 |

(Continued)

FOREIGN PATENT DOCUMENTS

WO  2015/089090  6/2015

OTHER PUBLICATIONS

Yang Yang et al., *Linearization of ADCs via Digital Post Processing*, 978-1-4244-9474-3/11 © 2011 IEEE, 4 pages.

(Continued)

*Primary Examiner* — Khai M Nguyen
(74) *Attorney, Agent, or Firm* — Patent Capital Group

(57) ABSTRACT

To address non-linearity, an on-chip linearization scheme is implemented along with an analog-to-digital converter (ADC) to measure and correct/tune for non-linearities and/or other non-idealities of the signal path having the ADC. The on-chip linearization scheme involves generating one or more test signals using an on-chip digital-to-analog converter (DAC) and providing the one or more test signals as input to the signal path to be linearized, and estimating non-linearity based on the one or more test signals and the output of the ADC. Test signals can include single-tone signals, multi-tone signals, and wideband signals spread over a range of frequencies. A time-delayed interleaving clocking scheme can be used to achieve a higher data rate for coefficient estimation without having to increase the sample rate of the ADC.

30 Claims, 13 Drawing Sheets

(56) References Cited

U.S. PATENT DOCUMENTS

| | | |
|---|---|---|
| 9,590,668 B1 | 3/2017 | Kim et al. |
| 9,935,645 B1 | 4/2018 | Tangudu et al. |
| 1,005,063 A1 | 8/2018 | Tangudu et al. |
| 2005/0219088 A1 | 10/2005 | Batruni |
| 2006/0273942 A1 | 12/2006 | Koste et al. |
| 2009/0058521 A1 | 3/2009 | Fernandez |
| 2012/0176191 A1 | 7/2012 | Kim et al. |
| 2016/0087604 A1 | 3/2016 | Kim et al. |

OTHER PUBLICATIONS

John Tsimbinos et al., *Input Nyquist Sampling Suffices to Identify and Compensate Nonlinear Systems*, IEEE Transactions on Signal Processing, vol. 46, No. 10, Oct. 1998, 1053-587-X/98 © 1998 IEEE, 5 pages.

Ifiok Umoh et al., *A 0.18μm CMOS Narrow-band LNA Linearization using Digital Base-band Post-Distortion*, 978-1-4244-9721-8/10 © 2010 IEEE, 4 pages.

Kutluyil Doğançay, *LMS Algorithm for Blind Adaptive Nonlinear Compensation*, School of Electrical and Information Engineering, University of South Australia, Downloaded on Mar. 2, 2009, 6 pages.

Kutluyil Doğançay, *Blind Compensation of Nonlinear Distortion for Bandlimited Signals*, IEEE Transactions on Circuits and Systems—I: Regular Papers, vol. 52, No. 9, Sep. 2005, 11 pages.

Mikko Valkama et al., *Advanced Digital Signal Processing Techniques for Compensation of Nonlinear Distortion in Wideband Multicarrier Radio Receivers*, IEEE Transactions on Microwave Theory and Techniques, vol. 54, No. 6, Jun. 2006, 11 pages.

John A. McNeill et al., *"Split ADC" Background Linearization of VCO-Based ADC's*, IEEE Transactions on Circuits and Systems—I: Regular Papers, vol. 62, No. 1, Jan. 2015, 10 pages.

Gert Cauwenberghs et al., *Adaptive Digital Correction of Analog Errors in MASH ADC's—Part I: Off-Line and Blind On-Line Calibration*, IEEE Transactions on Circuits and Systems—II: Analog and Digital Signal Processing, vol. 47, No. 7, Jul. 2000, 8 pages.

Péter Kiss et al., *Adaptive Digital Correction of Analog Errors in MASH ADCs—Part II: Correction Using Test-Signal Injection*, IEEE Transactions on Circuits and Systems—II: Analog and Digital Processing, vol. 47, No. 7, Jul. 2000, 9 pages.

Murmann, *Digitally Assisted Data Converter Design*, 978-1-4799-0645-1/13 © 2013 IEEE, 8 pages.

Ali et al., *A 14 Bit 1 GS/s RF Sampling Pipelined ADC with Background Calibration*, IEEE Journal of Solid-State Circuits, vol. 49, No. 12, Dec. 2014, 11 pages.

Devarajan et al., *A 12-b 10-GC/s Interleaved Pipeline ADC in 28-nm CMOS Technology*, IEEE Journal of Solid-State Circuits, vol. 52, No. 12, Dec. 2017, 15 pages.

Rakuljic et al., *In-situ nonlinear calibration of RF signal chain*, 978-1-5386-4881-0/18 © 2018 IEEE, 5 pages.

Taft et al., *A 1.8 V 1.0 GS/s 10b Self-Calibrating Unified-Folding-Interpolating ADC with 9.1 ENOB at Nyquist Frequency*, IEEE Journal of Solid-State Circuits, vol. 44, No. 12, Dec. 2009, 11 pages.

\* cited by examiner

SIGNAL PATH LINEARIZATION

FIELD OF THE DISCLOSURE

The present invention relates to the field of integrated circuits, in particular to techniques for linearizing signal paths.

BACKGROUND

In many electronics applications, an analog input signal is converted to a digital output signal (e.g., for further digital signal processing). For instance, in precision measurement systems, electronics are provided with one or more sensors to take measurements, and these sensors may generate an analog signal. The analog signal would then be provided to an analog-to-digital converter (ADC) as an input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs convert a continuous physical quantity that is also known as an analog signal to a digital signal whose values represent the quantity's amplitude (or to a digital signal carrying that digital number). An ADC is typically composed of many devices making up an integrated circuit or a chip. An ADC can be defined by the following exemplary application requirements: its power consumption, its bandwidth (the range of frequencies of analog signals that the ADC can properly convert to a digital signal), its resolution (the number of discrete levels the maximum analog signal can be divided into and represented by the digital signal), and its signal to noise ratio (how accurately the ADC can measure signal relative to the noise the ADC introduces). ADCs have many different designs, which can be chosen based on the application requirements. In many cases, it is not trivial to design an ADC that meets the application requirements while providing adequate performance. One critical limitation to the performance of an ADC is the linearity of the overall system, or the linearity of the ADC's signal path. Linearity can, for example, affect the signal-to-noise-and-distortion ratio (SINAD) and spurious free dynamic range (SFDR) of the ADC. In some cases, circuit designers achieve better linearity at the cost of implementing more complex and/or power hungry circuit designs. In some cases, non-linearity is unavoidable in certain circuit designs, for instance, due to mismatches or inherent characteristics in circuit components.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Summary of the Disclosure

Figure 1:
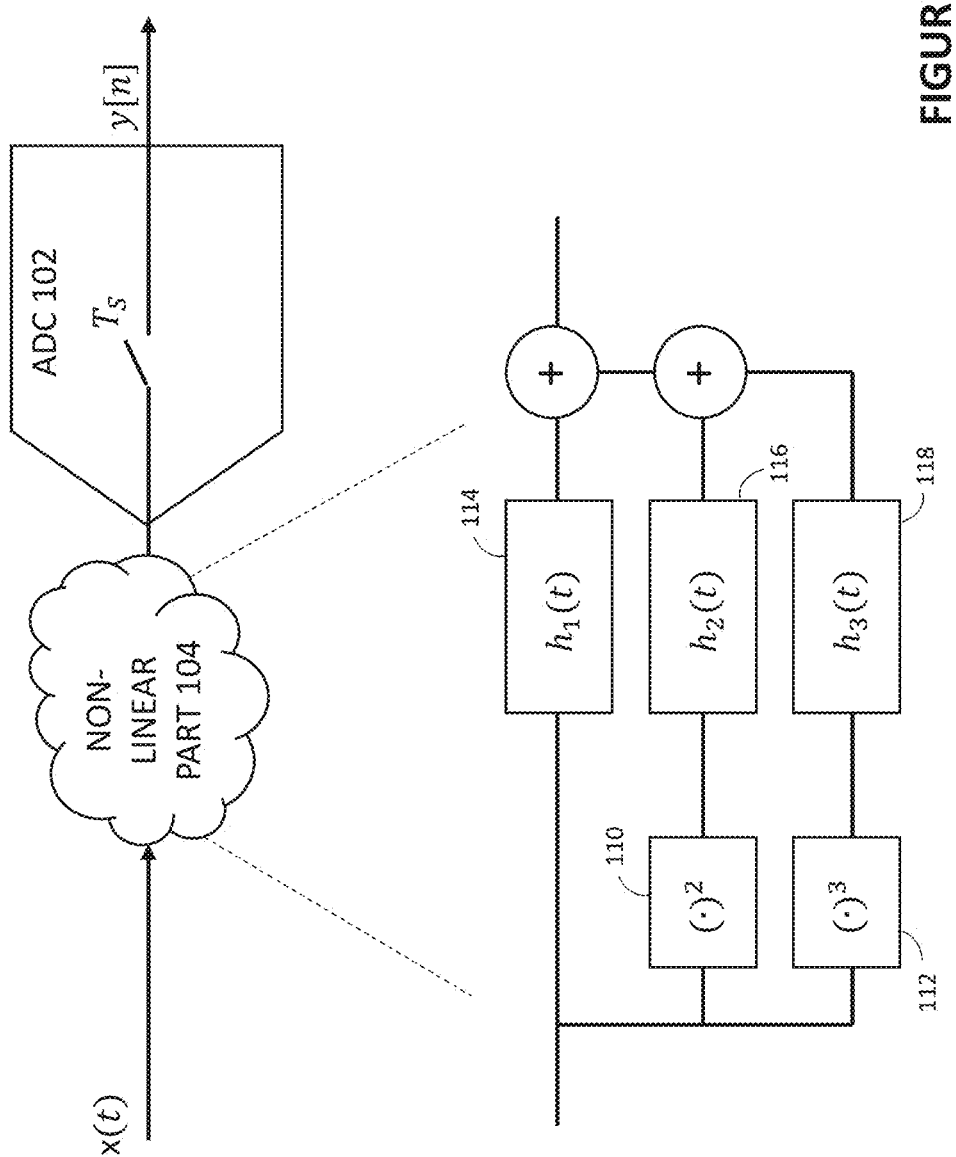
FIG. 1 illustrates non-linearities of a signal path, according to some embodiments of the disclosure.

To address non-linearity, an on-chip linearization scheme is implemented along with an analog-to-digital converter (ADC) to measure and correct/tune for non-linearities and/or other non-idealities of the signal path having the ADC. The on-chip linearization scheme involves generating one or more test signals using an on-chip digital-to-analog converter (DAC) and providing the one or more test signals as input to the signal path to be linearized, and estimating non-linearity based on the one or more test signals and the output of the ADC. Test signals can include single-tone signals, multi-tone signals, and wideband signals spread over a range of frequencies. A time-delayed interleaving clocking scheme can be used to achieve a higher data rate for coefficient estimation without having to increase the sample rate of the ADC.

Errors and Artifacts of Signal Chains Having ADCs

Although circuit designers aim to design and fabricate the perfect signal chain, the circuitry in the signal chain are often not perfect, or may not operate exactly as intended due to limitations in fabrication or inherent characteristics of the circuitry. For example, the circuitry's behavior may deviate from intended or desirable behavior due to changes in operating conditions such as temperature and aging of the substrate. These deviations and non-idealities can often lead to signal chains having undesirable errors and artifacts at its output.

Herein, "signal chain" and "signal path" are used interchangeably. The errors and artifacts can be caused by non-linearities of the circuitry in the signal chain, or more broadly, non-idealities of the circuitry in the signal chain. Herein, "non-linearities" and "non-idealities" are used interchangeably. Errors resulting from the non-linearities can depend on input signal frequency, clock rate, temperature, voltage supply, etc. "Linearization" and "calibration" are also used interchangeably (the latter being the broader term which can correct/tune for other non-idealities). The embodiments herein can perform both linearization and calibration.

For a signal chain having a data converter such as an ADC, the signal chain would have a contiguous chain of function blocks (the ADC being one of the function blocks). In the example of a signal chain having an ADC, several function blocks can precede or be upstream from the ADC, including function blocks such as a driving amplifier, an input buffer, a sampling network, a filter, etc. While schemes are available for injecting a test signal (or stimulus) directly to or in the ADC to linearize the ADC, not many schemes have been effectively implemented for linearizing the overall signal chain, including the ADC and the function blocks which precede or are upstream from the ADC. Linearizing the overall signal chain can address non-idealities of the function blocks which precede the ADC, and any non-idealities of the ADC which could not be corrected by linearization schemes in the ADC itself.

To linearize the overall signal chain, one or more test signals can be injected in front of a function block that precedes the ADC. The one or more test signals stimulate the signal chain, and measurements can be taken at an output of the ADC to estimate the non-idealities in the signal chain. The non-idealities of the signal can be digitally corrected at the output. The non-idealities of the signal can be calibrated out by tuning the analog circuitry. The one or more test signals can be injected in front an input buffer that precedes the ADC. A processor (e.g., microcontroller) can be used to estimate the non-idealities based on the one or more test signals and an output of the signal chain (e.g., the digital output of the ADC). In some cases, dedicated/specialized digital hardware can be used as the processor or implement some of the functions of the processor. Depending on particular linearization scheme, the one or more test signals can be injected in the foreground (while the signal chain has been taken offline), or in the background.

Providing an appropriate linearization scheme for the signal chain is not trivial, since the appropriate linearization scheme has to account for modeling of the system, design issues relating to generating the test signals and obtaining measurements for coefficient estimation, and formulating equations to properly extract coefficients for correcting or tuning the signal chain.

Modeling Non-Linearities

To address the non-linearities, a model is used to characterize the non-linearities of the function blocks which precede the ADC. For illustration, examples where the ADC is presumed to be mostly linear are described. Specifically, the examples focus on the non-linearities in the function blocks which precede the ADC, such as an input buffer and sampling network. For instance, an input buffer is often implemented to isolate the input and sampling circuitry for processing the input. The input buffer can be source follower which provides an ideal gain of 1. The sampling circuitry can, in some cases, include sample and hold circuitry or track and hold circuitry which enables one or more ADCs to hold a sample of the analog input signal for conversion. When the sampling network samples the input, the sampling network could potentially inject charge back out into the input if an input buffer is not implemented. The charge can cause ringing and distort the sampling network. The input buffer can provide a buffer to swallow the charge to prevent kick back. Typically, the input buffer is not linear and can add noise to the signal chain. To achieve more linearity in these function blocks typically requires more effort in designing the circuitry and/or circuitry which would consume more power. It would be advantageous to provide a signal path linearization scheme to account for function blocks which are not linear so that simpler and less power hungry circuitry can be used.

To model the function blocks and how non-linearity affects the analog input signal processed by the signal path, a Hammerstein model can be used. It is understood that other models can be used, and the Hammerstein model is merely an example. FIG. 1 illustrates non-linearities of a signal path, according to some embodiments of the disclosure. In particular, FIG. 1 shows a signal path receiving an analog input signal x(t), which is processed by a non-linear part 104 (e.g., function blocks which precede ADC 102), and subsequently converted to a digital output signal y[n] by ADC 102. $T_s$ denotes a sampling clock which controls the sampling mechanism of the ADC 102 (which samples at a sampling frequency of $f_s$). Focusing on the non-linear part 104, it can be seen that the non-linearities can be modeled by a generalized Hammerstein model comprising multiple parallel branches. There can be a N parallel branches ($branch_1$, $branch_2$, $branch_3$, . . . $branch_N$), and in this example, three parallel branches are shown. Each branch includes a static non-linearity part followed by a linear dynamic (memory) part. The static non-linearity part can be represented by an nth order power static non-linear function, seen as $(\bullet)^2$ in block 110, and $(\bullet)^3$ in block 112. The linear dynamic part can be represented by a linear filter, seen as $h_1(t)$ in block 114, $h_2(t)$ in block 116, and $h_3(t)$ in block 118. The model can represent non-linearity that resides in different points of the signal path, such as non-linear part 104.

The technical task is to estimate the $h_2(t)$ and $h_3(t)$ of the model based on digital output signal y[n] such that the non-linearities can be corrected in the digital output signal y[n] or tuned out in the analog circuitry. Estimating $h_2(t)$ and $h_3(t)$ can enable coefficients to be determined, where the coefficients can be used for digital correction or analog tuning. Non-linearity coefficients are not constant across frequency due to the linear dynamic (memory) parts.

On-Chip Test Signal Generation and Estimation of Coefficients

To estimate $h_2(t)$ and $h_3(t)$, a linearization scheme can inject one or more test signals to the signal path, in front of non-linear part 104. Rather than performing a linearization scheme in a laboratory or simulated setting, or during testing of an integrated circuit during fabrication, an improved linearization system can linearize the signal chain in the integrated circuit after the integrated circuit is mounted on a circuit board of an electronic device, either in the foreground or in the background. The improved linearization system, thus, is an on-chip solution being able to linearize the signal chain without requiring special inputs to be generated and provided to the integrated circuit or external components to estimate and correct for and/or tune out the non-linearity. In other words, the integrated circuit can linearize itself, and can apply a linearization scheme on-demand to account for any non-linearities which may change over time.

Figure 2:
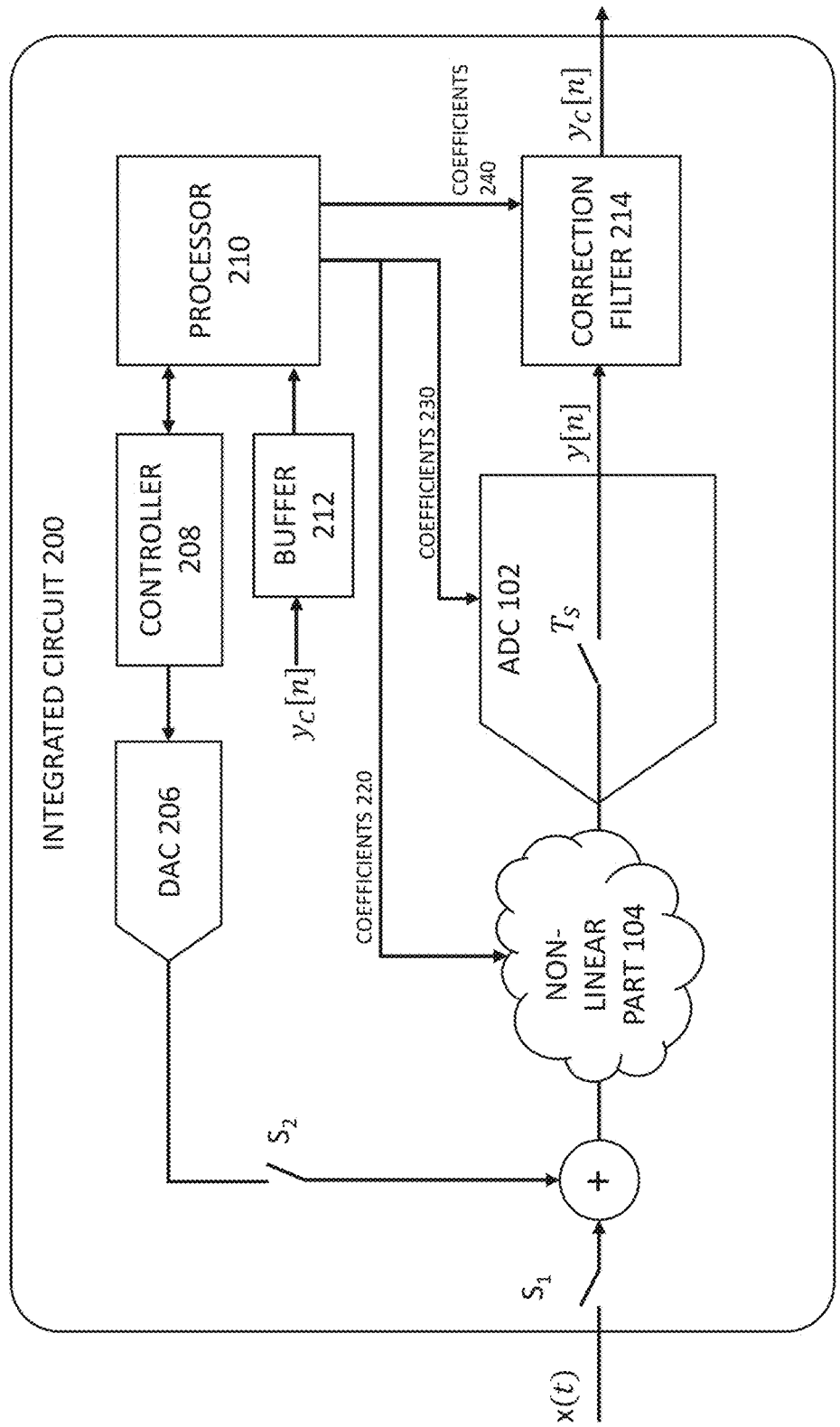
FIG. 2 shows an exemplary integrated circuit having on-chip signal path linearization, according to some embodiments of the disclosure.

FIG. 2 shows an exemplary integrated circuit having on-chip signal path linearization, according to some embodiments of the disclosure. The integrated circuit 200 includes the signal path seen in FIG. 1, which receives an analog input signal x(t). The analog input signal x(t) gets distorted by the non-linear part 104 and is subsequently converted by ADC 102 into a digital output signal y[n]. To provide the on-chip signal path linearization solution, the integrated circuit 200 includes a digital-to-analog converter (DAC) 206, a controller 208, and a processor 210 (e.g., a microprocessor). The on-chip DAC 206 can generate one or more test signals. The controller 208 can provide a digital input signal to the DAC 206 so that the DAC 206 can generate the one or more test signals. In other words, the DAC 206 receives a digital input signal, e.g., a sequence, from the controller 208 and generates the one or more test signals in an analog form based on the digital input signal from the controller 208. Advantageously, since the DAC 206 is on-chip with the ADC 106, the clock driving DAC 206 can come from the same clock driving the ADC 102 (ADC sampling clock). The ADC 102 can receive the one or more test signals provided/injected to the signal path and convert the one or more test signals to a digital output, i.e., y[n]. The processor 210 can estimate coefficients corresponding to non-linearities of the signal path based the digital output signal y[n] or $y_c$[n].

For foreground calibration schemes, the integrated circuit 200 can further includes a first switch (e.g., switch $S_1$) for disconnecting the signal path from receiving an external analog input x(t) during a calibration phase, and a second switch (e.g., switch $S_2$) for coupling an analog output of the DAC 206 to the signal path during the calibration phase. Effectively, the first and second switches take the signal path offline to allow the on-chip solution to inject one or more test signals and determine coefficients for correction/tuning. It is not necessary for switches to be used to inject the test signals. A summing node can serve the purpose for allowing the test signals to be injected into the signal path.

The on-chip signal path linearization solution does not require the ADC 102 to have a particular architecture. For instance, the ADC 102 can be a pipelined ADC, or a time-interleaved ADC having multiple ADCs.

The on-chip DAC 206 is preferably more linear than the targeted linearity of the signal path after linearization. Furthermore, the on-chip DAC 206 is preferably capable of generating one or more test signals which are appropriate for linearization.

The controller 208 can be provided to control the DAC 206 to generate the one or more test signals, e.g., by clocking the DAC 206 and providing a suitable digital input signal (e.g., a sequence of digital values) to the DAC 206.

The processor 210 can be a microprocessor configured to execute instructions stored on non-transitory computer-readable memory to perform calculations for determining coefficients for the linearization solution. The coefficients are typically determined to reverse or compensate for the effects of the non-linearities of the signal path. In some cases, starting coefficients for the linearization solution are determined offline at the tester (and stored in a non-transitory computer-readable medium on-chip with the microprocessor), and the calculations described herein can be used to update the starting coefficients.

The integrated circuit can further include a buffer 212 for capturing (e.g., storing) values of the digital output signal. The buffer can include non-transitory computer-readable memory for storing values of the digital output signal. The digital output signal represents the one or more test signals being injected into the signal path and one or more components associated with any non-linearities in the signal path (stimulated by the one or more test signals). Accordingly, the processor 210 can extract the one or more components associated with the non-linearities from the digital output signal to estimate coefficients for linearizing the signal path. The digital output signal can be a suitable digital output signal of the signal path, such as the digital output signal y[n] of the ADC 102, or a derivation of y[n]. The processor 210 can access the buffer 212 to obtain values of the digital output signal (i.e., data) for estimating the coefficients corresponding to non-linearities of the signal path. In some cases, the buffer captures values of the digital output signal y[n]. In some cases, the buffer captures values of the corrected digital output signal $y_c$[n], to implement an adaptation scheme that updates the coefficients as the digital output signal y[n] is corrected to generate the corrected digital output signal $y_c$[n]. In some cases, the buffer performs digital processing on the digital output signal $y_c$[n] to derive or form measurement data upon which the processor 210 can determine coefficients.

One or more mechanisms can be implemented to linearize the signal path. Linearization can occur through tuning of circuitry in the signal path to calibrate out non-linearities of the signal path and/or filtering the digital output signal $y_c$[n] to correct for non-linearities. The processor 210 is adapted to properly compute appropriate coefficients to linearize the signal path. A first example is by estimating coefficients 220 which can be used to tune the circuitry in the non-linear part 104. Another example is by estimating coefficients 230 which can be used to tune the circuitry in the ADC 102. The circuitry in the signal path (i.e., circuitry in the non-linear part 104 and the circuitry in the ADC 102) can include digital controls which are controllable by coefficients to adjust circuit parameters such as bias current, bias voltages, trimmable transistors, and trimmable capacitances. Yet another example is by implementing a correction filter 214 to filter the digital output signal y[n] of the ADC 102 to generate a corrected digital output signal $y_c$[n] to correct for the non-linearities. The processor 210 can write coefficients 240 to digital filters in the correction filter 214, and the correction filter 214 can filter the digital output signal y[n] to generate the corrected digital output signal $y_c$[n].

Figure 3:
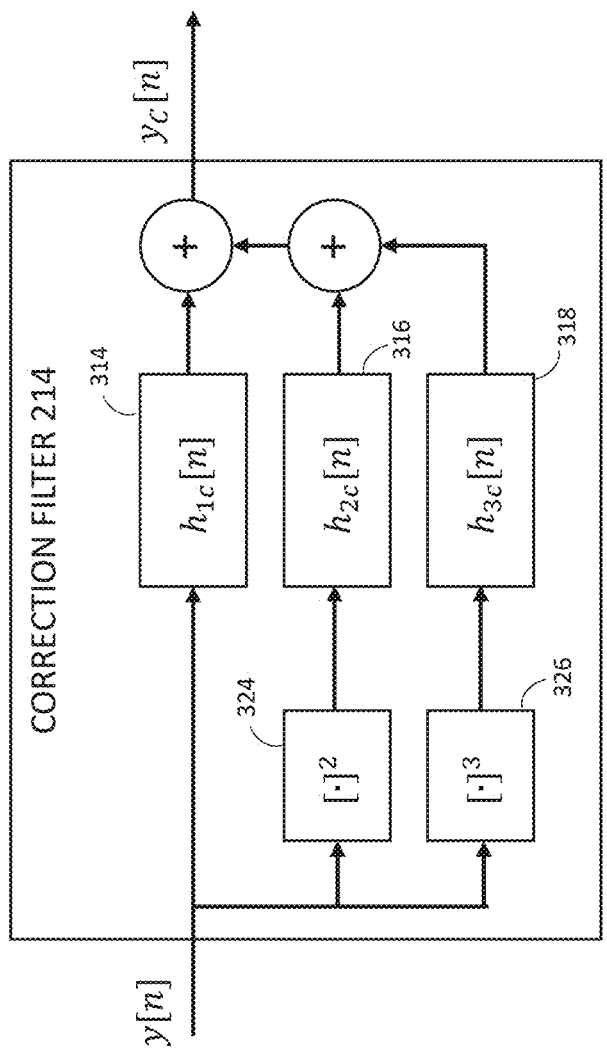
FIG. 3 illustrates an exemplary correction scheme, according to some embodiments of the disclosure.

FIG. 3 illustrates an exemplary correction scheme based on digital filtering, according to some embodiments of the disclosure. Correction schemes can vary depending on the modeling of the non-linearities, i.e., correction filters and the structure formed by the correction filters can vary depending the "terms" being used for correcting the non-linearities and the particular digital design for the correction filter 214. These "terms" can refer to terms in a mathematical formulation that relates y[n] to $y_c$[n] (e.g., $y_c$[n]=f(y[n])). For instance, the "terms" can be additive terms which are combined to form $y_c$[n] based on y[n]. To perform digital correction, "terms" are generated from the digital output signal y[n] and different coefficients are applied to the corresponding "terms" and the results are summed to form the corrected digital output signal $y_c$[n]. The processor 210 can compute these coefficients, based on estimated non-linearities of the signal path, to program the correction filter 214 appropriately.

In this example in FIG. 3, digital filters seen in correction filter 214 can be used to digitally correct non-linearities. The processor 210 can compute coefficients for digital filters $h_{1c}$[n] 314, $h_{2c}$[n] 316, and $h_{3c}$[n] 318. The digital output signal y[n] can be processed by parallel branches which are subsequently summed together to form the corrected digital output signal $y_c$[n]. In a given branch, a "term" is generated by applying a function to the signal y[n], such as functions $[\cdot]^2$ 324 and function $[\cdot]^3$ 326. Each term formed by the branches is then filtered by digital filters $h_{1c}$[n] 314, $h_{2c}$[n] 316, and $h_{3c}$[n] 318, which can be finite impulse response (FIR) filters. The coefficients computed by the processor 210 would correspond to the taps of the FIR filters. Such an example seen in FIG. 3 can be effective for correcting non-linearities.

Generally speaking, the filtering structure for correction filter 214 would depend on the model being used to model the non-linearities. Specifically, the correction filter 214 can mirror the model. In some models, some terms may be delayed to better or more efficiently model dynamic (memory) non-linearities. In those cases, delay blocks within a different filtering structure can be used in correction filter 214 to correct for dynamic (memory) non-linearities. In some cases, "cross-terms" can be generated from different delayed versions of the digital output signal y[n].

Tonal Calibration

Figure 4:
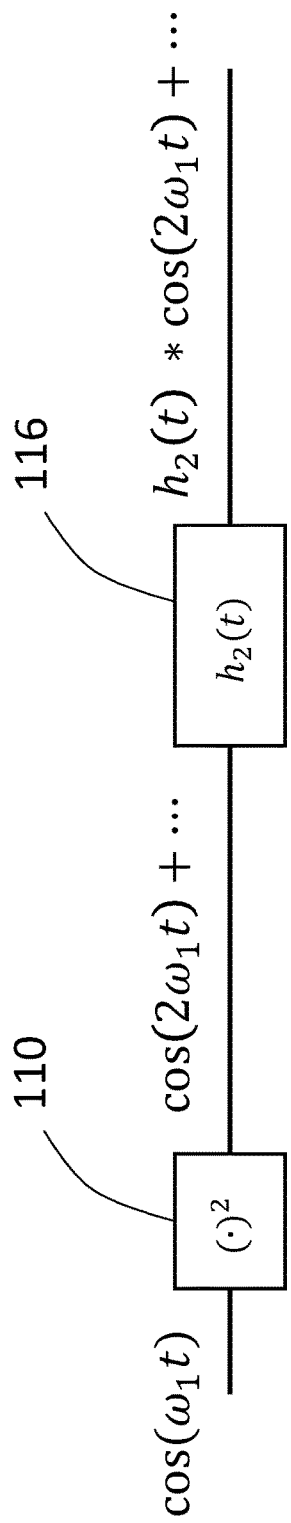
FIG. 4 illustrates tonal calibration, according to some embodiments of the disclosure.

One way to estimate $h_2(t)$ and $h_3(t)$ is to inject tonal inputs, e.g., one or more single-tone and/or multi-tone test signals, to the signal path, e.g., in front of non-linear part 104. FIG. 4 illustrates tonal calibration, according to some embodiments of the disclosure. A tone can take the form of:

$$\cos(\omega_k t) \quad \text{(eq. 1)}$$

The tone, or tonal input, is thus a cosine wave having frequency $\omega_k$. In some cases, the tonal input can have multiple tones, meaning $\cos(\omega_1 t)+\cos(\omega_2 t)+\ldots$, or in other words, the tonal input can be represented as a sum of multiple cosines at different frequencies. To stimulate the signal path to extract frequency dependent non-linearities, tonal inputs having input frequencies sweeping across one or more Nyquist zone of the ADC in the signal path can be applied as test signals to the signal path and digital outputs of the signal path corresponding to the tonal inputs having different frequencies are captured for processing and analysis by the processor or other suitable circuitry on the integrated circuit. For instance, the tonal inputs can have input frequencies sweeping across a suitable range of frequencies of the ADC. The suitable range of frequencies can be a single Nyquist zone of the ADC, e.g., the first Nyquist zone of the ADC, or the second Nyquist zone of the ADC, etc.

The on-chip DAC can generate the tonal inputs. For instance, the controller can control the DAC to generate single-tone signals as the one or more test signals. In some embodiments, the controller can control the digital-to-analog converter to generate multi-tone signals as the one or more test signals. The one or more test signals can include tones having respective frequencies across the first Nyquist zone of the ADC (from DC or zero frequency to $f_s/2$, where $f_s$ is the sampling frequency of the ADC). A buffer can capture values of the digital output signal of the ADC. The processor can process the captured values to estimate coefficients for linearizing the signal path.

When a given tonal input is injected to the signal path, non-linearities of the signal path causes harmonics (or more broadly, non-linear components) to show up at the output of signal path. One of the branches of FIG. 1, the second order branch, is shown in FIG. 4 to illustrate the effect of the non-linearities showing up as a second harmonic (HD2) at the output. When a tone $\cos(\omega_1 t)$ having frequency $\omega_1$ is applied as a test signal, $\cos(\omega_1 t)$ becomes $\cos(2\omega_1 t)+\ldots$ after a second order power static non-linear function is applied, seen as $(\bullet)^2$ in block 110. $\cos(2\omega_1 t)+\ldots$ becomes $h_2(t)*\cos(2\omega_1 t)+\ldots$ after going through a linear filter, seen as $h_2(t)$ in block 116. Note that:

$$h_2(t)*\cos(2\omega_1 t)=|H_2(j2\omega_1)|\cos(2\omega_1 t+\angle H_2(j2\omega_1)) \quad \text{(eq. 2)}$$

Figure 5:
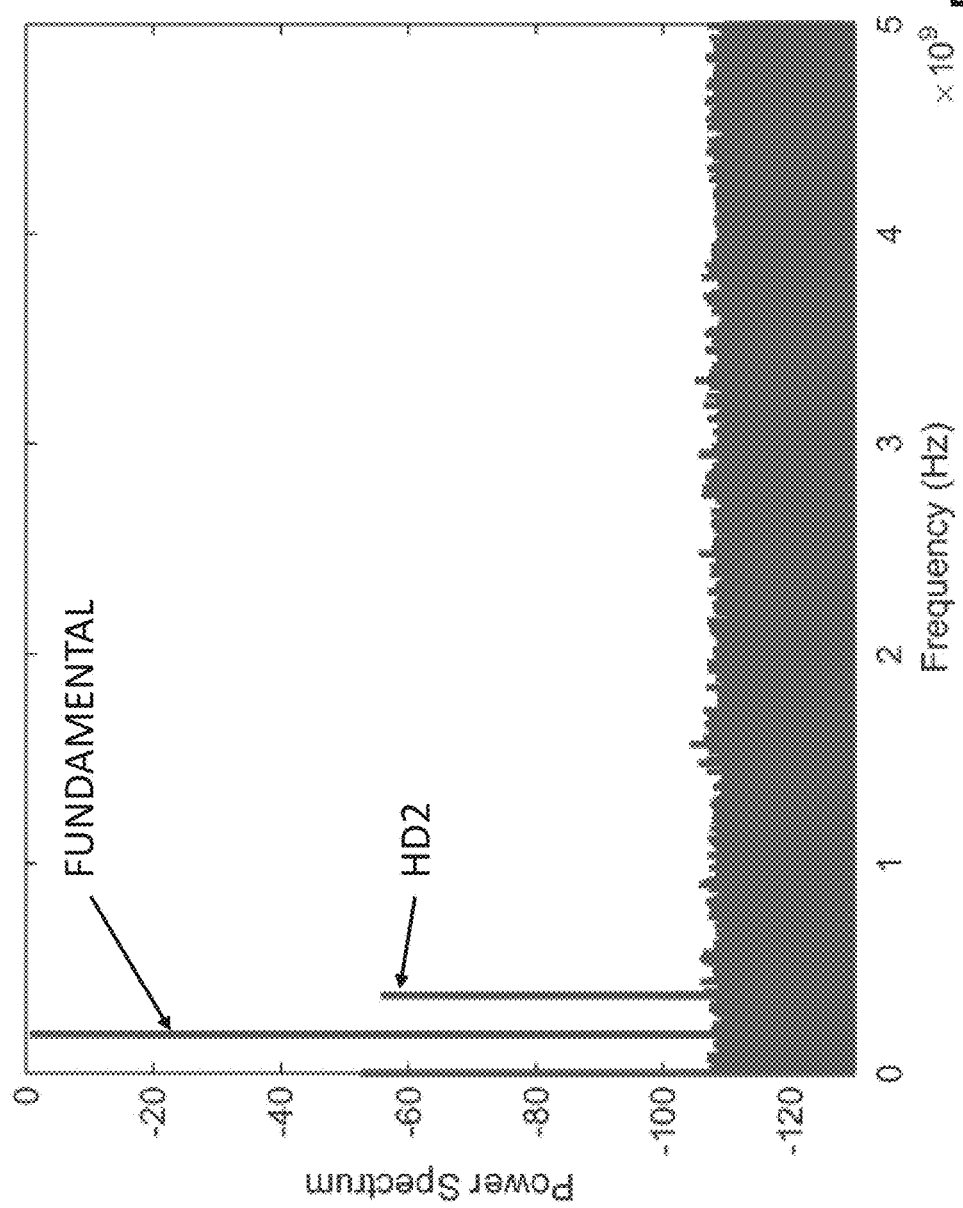
FIG. 5 illustrates a power spectrum over frequency of an ADC output, according to some embodiments of the disclosure.

$|H_2(j2\omega_1)|$ is the magnitude component of $h_2(t)$, and $\angle H_2(j2\omega_1)$ is the phase component of $h_2(t)$. Based on the above formulation, it is possible to extract information about $h_2(t)$ by examining results from a Discrete Fourier Transform (DFT) (e.g., a Fast Fourier Transform (FFT)) on the digital output signal of the signal path. Specifically, the magnitude and phase information at frequency $2\omega_1$ (i.e., where the harmonic is located) can provide information about $h_2(t)$. The results of the DFT can include a power spectrum over frequency of an ADC output, as seen in FIG. 5, where the FIGURE shows a fundamental tone ("fundamental") and a second harmonic tone ("HD2"). The results of the FFT can include a phase spectrum over frequency of an ADC output (not shown in the FIGURES).

In practice, the tonal input is not purely $\cos(\omega_1 t)$, but can be better represented as $A\cos(\omega_1 t+\phi)$. In other words, the tonal input has amplitude A and phase $\phi$ associated with the tonal input. When $A\cos(\omega_1 t+\phi)$ goes through the signal chain, the result through the second order branch is the following:

$$h_2(t)*\frac{A^2}{2}\cos(2\omega_1 t+2\phi)= \quad \text{(eq. 3)}$$
$$\frac{A^2}{2}|H_2(j2\omega_1)|\cos(2\omega_1 t+2\phi+\angle H_2(j2\omega_1))$$

Analysis of the FFT may need to account for the magnitude and phase (corresponding to amplitude A and phase $\phi$ of the tonal input) of the fundamental at frequency $\omega_1$ as well as the magnitude and phase information of the harmonic at frequency $2\omega_1$ to obtain information about $h_2(t)$. Similar formulations can be applied to determine non-linearities which show up as a third harmonic (HD3) at the output to determine information associated with $h_3(t)$.

Generally, a frequency range is determined, and K number of equally-spaced tones sweeping the frequency range are injected one by one into the ADC. Output data that corresponds to the K tones, i.e., K data sets, can be captured at the output of the ADC for further analysis. By injecting tonal inputs at different frequencies, it is possible to extract information associated with filters such as $h_2(t)$ and $h_3(t)$ at different frequencies based on the K data sets. Each data set can provide information about one or more filters of interest at a given frequency. The extracted information from the K data sets across multiple frequencies can be used to reconstruct a filter of interest, e.g., $h_2(t)$, $h_3(t)$, (which corresponds to $h_2[n]$, $h_3[n]$ in the correction filter). For instance, for each data set, it is possible to extract a pair of magnitude and phase information associated with the filter of interest by relating (certain magnitude and phase information associated with) the fundamental and a non-linear component in the output of the ADC (i.e., by examining the FFT of the output data collected from injecting a given tone). Another pair of magnitude and phase information can be extracted from a given data set for another filter of interest. Details of how to relate the fundamental and a non-linear component in the FFT to extract magnitude and phase information for a filter of interest are explained through examples described herein.

Accordingly, the extracted information from injecting K tones into the ADC can include K pairs of magnitude and phase information associated with different frequencies for a given filter of interest. (Another set of pairs of magnitude and phase information can be extracted for another non-linear component from the same or different data set from a previous analysis.) The K pairs of magnitude and phase information forms (in some cases, a coarse) frequency domain representation of the given filter. A digital filter in the correction filter can be determined based on the K pairs of magnitude and phase information. Depending on the desired digital correction, different processing schemes can be applied to the K pairs of magnitude and phase information or a subset of the K pairs of magnitude and phase information to determine the digital filter. For instance, an inverse transformation (e.g., from frequency domain information into time domain information) on the K pairs of magnitude and phase information (or a derivation thereof) can yield coefficients for a digital filter, e.g., $h_2[n]$ and $h_3[n]$. The number of taps being used for the digital filters can vary depending on the implementation. In some cases, the result of the inverse transformation can be truncated to map the result to coefficients of a suitable number of taps for the digital filter. The time domain representation of the filter based on the K pairs of magnitude and phase information can be determined through other methods besides the inverse transformation.

In some embodiments, the test signal can be a multi-tone signal. Injecting a multi-tone signal can allow the calibration to estimate coefficients which can correct for two-tone distortions (inter-modulation or IMD). For IMD terms, the challenge is to find out how differently spaced tones (in frequency) relate to the IMDs that the tones generate. For instance, for second order and third order IMD estimation, a multi-tone signal having tones at $f_1$, $f_2$ can generate tones at $f_1 \pm f_2$, $2f_1 \pm f_2$, $2f_2 \pm f_1$. By observing the FFT of the digital output signal generated from injecting multi-tone test signals, IMD terms can be estimated.

Considerations Associated with Using an On-Chip DAC for Tonal Calibration

Several considerations are taken into account to ensure the tonal calibration scheme works properly and well. As mentioned before with FIG. 2, the on-chip DAC is preferably more linear than the targeted linearity of the signal path after linearization. Otherwise, the calibration scheme may be less likely to be able to improve the linearity of the overall signal chain if the tone being generated and injected is very non-linear. Also, the on-chip DAC can generate images besides the desired tone. The images generated by the on-chip DAC could be problematic when the frequency of the tone is close to the half the sampling frequency of the ADC (e.g., $f_s/2$). Specifically, the images make it difficult to estimate information associated with $h_2(t)$ and $h_3(t)$ for high frequency inputs close to $f_s/2$ (when $f_{in}$ is close to $f_s/2$). To counter this issue, estimated frequency responses for $h_2(t)$ and $h_3(t)$ can be artificially set to a pre-determined value, such as zero, close to $f_s/2$. In some cases, the frequency responses can artificially taper off to zero as the response gets close to $f_s/2$. This ensures that the coefficients determined from the frequency responses would not make the performance (i.e., linearity) worse for inputs close to $f_s/2$. Increasing the rate of the DAC can lessen the problem, but at the cost of greater complexity.

Figure 6:
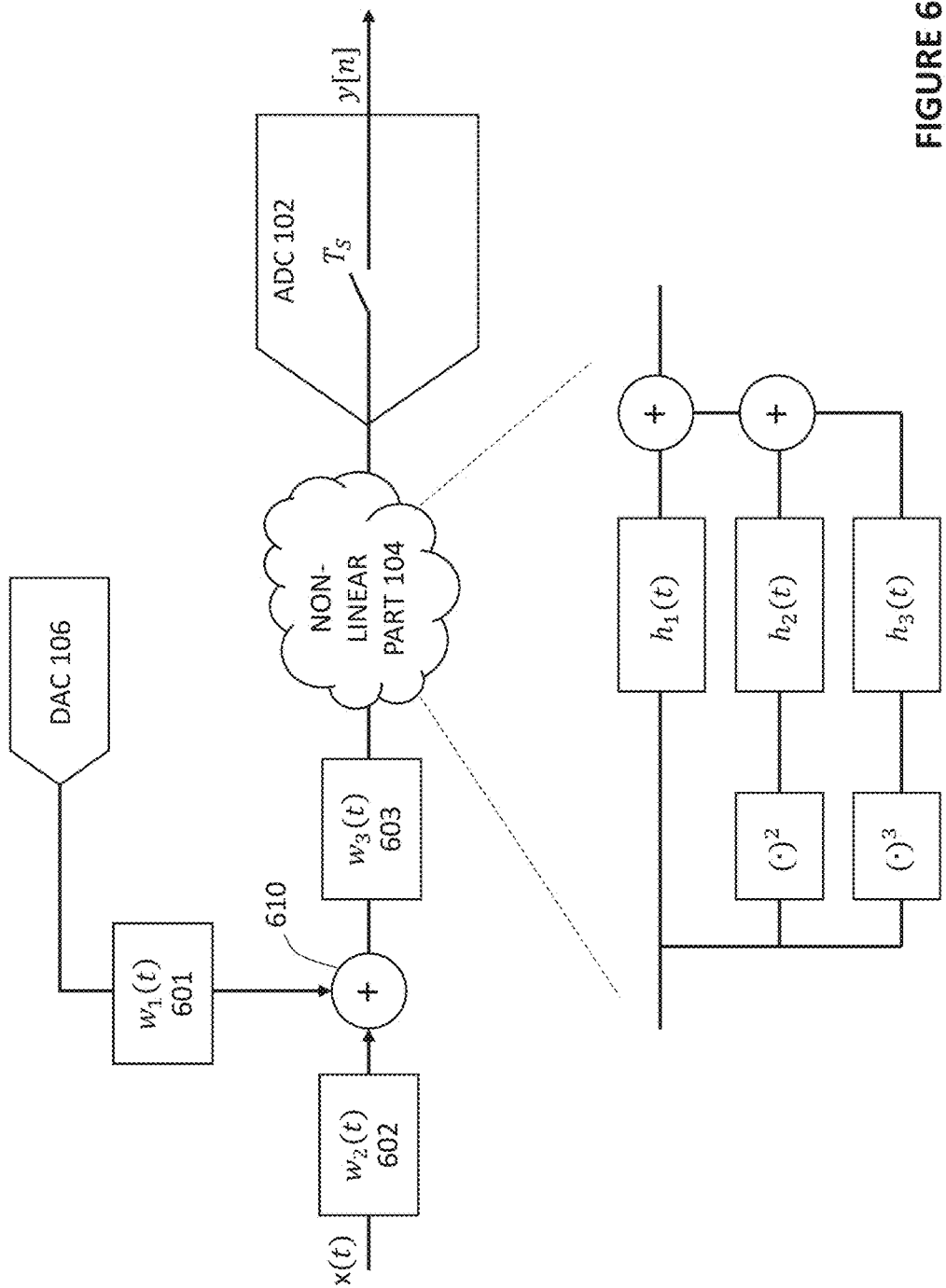
FIG. 6 illustrates frequency responses in different signal paths for on-chip tonal calibration, according to some embodiments of the disclosure.

When using an on-chip DAC, the tonal calibration scheme may need to consider whether discrepancy between the on-chip DAC injection path and the input signal path would affect the estimation process. FIG. 6 illustrates frequency responses in different signal paths for on-chip tonal calibration, according to some embodiments of the disclosure. As shown, the input signal path from $x(t)$ to the non-linear part 104 is modeled by two frequency responses, $w_2(t)$ 602 and $w_3(t)$ 603 (separated by a node 610 which connects the DAC 206 output to the signal path). The DAC injection path is modeled by a frequency response $w_1(t)$ 601 and $w_3(t)$ 603. Depending on how the non-linearities are extracted, it is possible that the discrepancies or mismatches between these frequency responses would show up as a "false" non-linearity and cause the correction/tuning scheme to be incorrectly correcting for errors which are not associated with the actual non-linearities of the signal path. One consideration is for any mismatches between $w_1(t)$ 601 and $w_2(t)$ 602. Advantageously, the tonal calibration scheme is setup to model and extract the response (e.g., $h_1(t)$, $h_2(t)$ and $h_3(t)$) in the non-linear part 104, mismatches between $w_1(t)$ 601 and $w_2(t)$ 602 would not matter. Another consideration is for any mismatches between $w_1(t)$ 601 and $w_3(t)$ 603. Advantageously, the tonal calibration scheme is setup in such a way that the effect of $w_1(t)$ 601 and $w_3(t)$ 603 does not show up in the estimation calculations. Specifically, the tonal calibration scheme compares the fundamental relative to the harmonic (e.g., HD2 and HD3) to estimate $h_2(t)$ and $h_3(t)$, and finds the relationship between the fundamental and the harmonic. The relative measurement enables the effect of $w_1(t)$ 601 and $w_3(t)$ 603 to fall out in the calculations. To implement the estimation scheme, the on-chip processor can estimate the coefficients for linearizing the signal path by comparing a fundamental and a harmonic in the digital output signal. In particular, the on-chip processor can compare the magnitude and phase information of the fundamental and the magnitude and phase information of the harmonic to extract information about the non-linearities. From the information, coefficients can be estimated or determined for linearizing the signal path. The comparison results in $w_1(t)$ 601 and $w_3(t)$ 603 not being a factor in the estimation calculations. In other words, the transfer functions (or responses) in the DAC injection path falls out when the non-linearities are being characterized. The principle is that the fundamental and the harmonic both experiences the same transfer functions $w_1(t)$ 601 and $w_3(t)$ 603. The comparison serves as a "differential" measurement, and the transfer functions $w_1(t)$ 601 and $w_3(t)$ 603 would get taken out in the estimation calculations.

Figure 7:
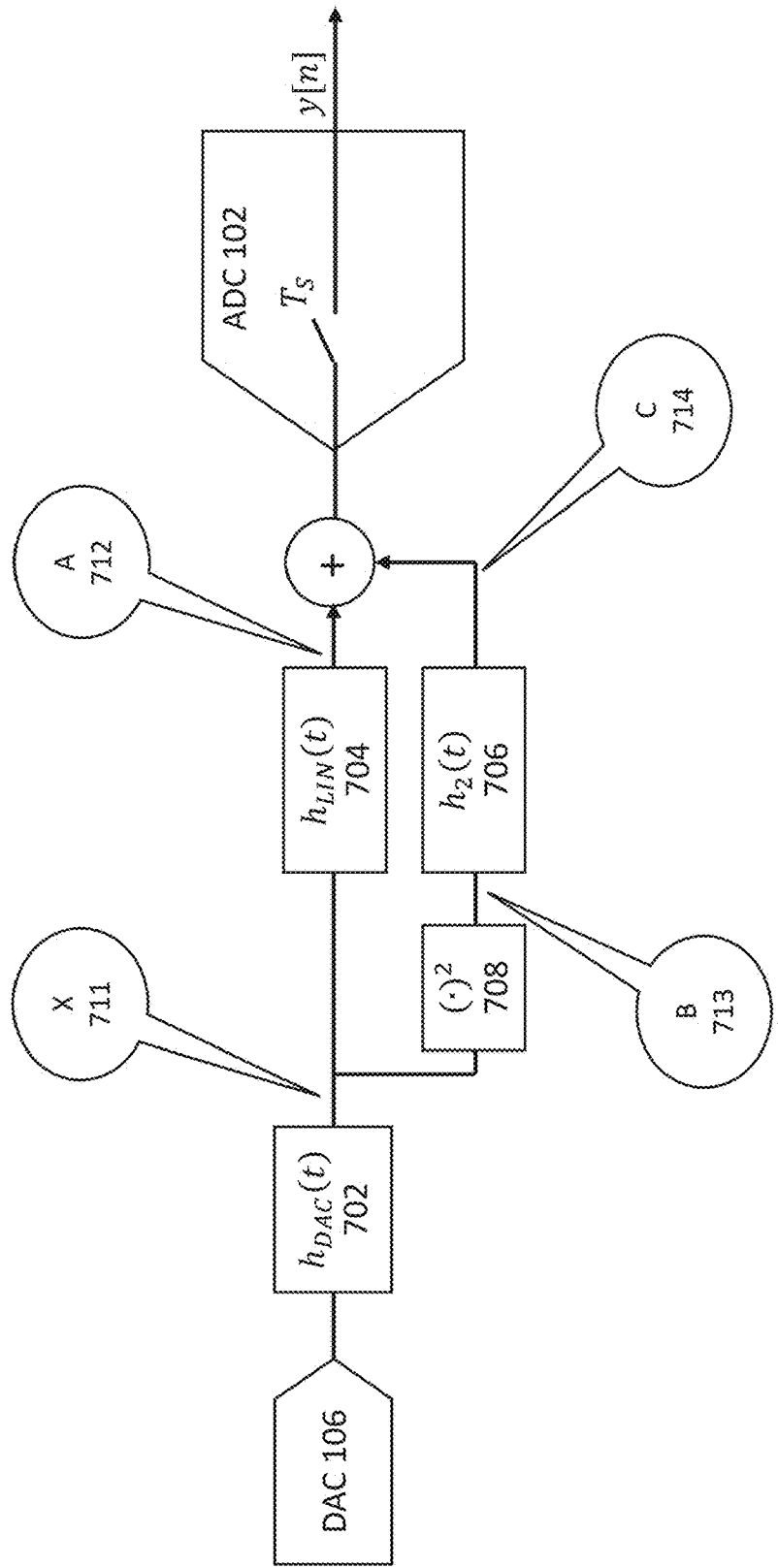
FIG. 7 illustrates cancellation of effect of frequency response in the digital-to-analog converter signal path for on-chip tonal calibration, according to some embodiments of the disclosure.

FIG. 7 illustrates cancellation of effect of frequency response in the DAC signal path for on-chip tonal calibration, according to some embodiments of the disclosure. FIG. 7 also illustrates the estimation calculations which compares the fundamental and the second harmonic to extract information about $h_2(t)$. While the comparison between the fundamental and other harmonics (e.g., HD3) are not shown, it is understood that the similar principles apply to other comparisons as well (to achieve the same advantageous effect). During a calibration phase, a switched is closed to form the DAC injection path, and another switch is opened to take the ADC 102 offline from the normal input for calibration. Transfer function (or response) $h_{DAC}(t)$ 702 represents the effect of $w_1(t)$ 601 and $w_3(t)$ 603. $h_{LIN}(t)$ 704 represents the transfer function for the first order branch, and $h_2(t)$ 706 represents the transfer function in the second order branch, which includes the function $(\cdot)^2$ 708. The first order and the second order branches are part of the model for the non-linear part of the signal chain preceding the ADC (as previously illustrated by FIG. 1).

During the calibration phase, the on-chip DAC 206 generates a tone at $\omega_c$. At the output of $h_{DAC}(t)$ 702, denoted by X 711, the signal would have the form:

$$|H_{DAC}(j\omega_c)|\cos(\omega_c t + \angle H_{DAC}(j\omega_c)) \quad\quad\quad (\text{eq. 4})$$

After passing through transfer function $h_{LIN}(t)$ in the first order branch, the signal at the output of $h_{LIN}(t)$, denoted by A 712, would have the form:

$$|H_{DAC}(j\omega_c)||H_{LIN}(j\omega_c)|\cos(\omega_c t + \angle H_{DAC}(j\omega_c) + \angle H_{LIN}(j\omega_c)) \quad\quad\quad (\text{eq. 5})$$

After passing through function $(\cdot)^2$ 708 of the second order branch, the signal at the output of function $(\cdot)^2$ 708, denoted by B 713, would have the form:

$$|H_{DAC}(j\omega_c)|^2 \cdot \frac{1}{2}\cos(2\omega_c t + 2\angle H_{DAC}(j\omega_c)) + \frac{1}{2}|H_{DAC}(j\omega_c)|^2 \quad \text{(eq. 6)}$$

The trigonometry identity used for the above formulation was:

$$(a \cdot \cos(\omega_c t))^2 = a^2 \left( \frac{1 + \cos(2\omega_c t)}{2} \right) \quad \text{(eq. 7)}$$

After the signal at B 713 passes through transfer function $h_2(t)$ 706 of the second order branch, the signal at the output of $h_2(t)$ 706, denoted by C 714, would have the form:

$$|H_{DAC}(j\omega_c)|^2 |H_2(j2\omega_c)| \cdot \quad \text{(eq. 8)}$$
$$\frac{1}{2}\cos(2\omega_c t + 2\angle H_{DAC}(j\omega_c) + \angle H_2(j2\omega_c)) + \{\text{DC term}\}$$

Equation 8 has the {DC term}, $\frac{1}{2}|H_{DAC}(j\omega_c)|^2$, but the {DC term} is ignored for simplicity since it does not impact the magnitude and the phase computations.

To estimate $h_2(t)$, the signal at A 712 (the fundamental) and the signal at C 714 (the second harmonic HD2) are compared against each other. Specifically, the signal at A 712 (represented by Equation 5) is squared to form "a correcting signal" and compared against signal at C 714 (represented by Equation 7). The magnitude and phase information of the squared signal at A 712 ("the correcting signal") is compared against the magnitude and phase information of the signal at C 714. The magnitude and phase difference resulting from the comparison can become the magnitude response and phase response of a correction filter that can correct the non-linearities.

Squaring the signal at A 712 represented by Equation 5 yields:

$$|H_{DAC}(j\omega_c)|^2 |H_{LIN}(j\omega_c)|^2 \cos(2\omega_c t + 2\angle H_{DAC}(j\omega_c) + 2\angle H_{LIN}(j\omega_c)) + \{\text{ignoring DC term}\} \quad \text{(eq. 9)}$$

From Equation 9, the squared signal at A 712 ("a correcting signal") has a magnitude of:

$$|H_{DAC}(j\omega_c)|^2 |H_{LIN}(j\omega_c)|^2 \quad \text{(eq. 10)}$$

From Equation 8, the signal at C 714 has a magnitude of:

$$|H_{DAC}(j\omega_c)|^2 |H_2(j2\omega_c)| \quad \text{(eq. 11)}$$

Note that the magnitude information of the squared signal at A 712 and the signal at C 714 correspond to the magnitudes of the fundamental and the harmonic observable from the DFT (e.g., FFT) of the digital output signal. When comparing the magnitude of squared signal at A 712 ("the correcting signal") and the magnitude of signal at C 714, Equation 10 is divided by Equation 11:

$$\frac{|H_{DAC}(j\omega_c)|^2 |H_{LIN}(j\omega_c)|^2}{|H_{DAC}(j\omega_c)|^2 |H_2(j2\omega_c)|} = \frac{|H_{LIN}(j\omega_c)|^2}{|H_2(j2\omega_c)|} \quad \text{(eq. 12)}$$

In Equation 12, it can be seen that the $|H_{DAC}(j\omega_c)|$ term is cancelled out through the division. Accordingly, the estimation does not depend on $h_{DAC}(t)$ 702. The magnitude of the correction filter at $2\omega_c$ can be set to the expression in Equation 12.

From Equation 9, the squared signal at A 712 has a phase of:

$$2\angle H_{DAC}(j\omega_c) + 2\angle H_{LIN}(j\omega_c) \quad \text{(eq. 13)}$$

From Equation 8, the signal at C 714 has a phase of:

$$2\angle H_{DAC}(j\omega_c) + \angle H_2(j2w_c) \quad \text{(eq. 14)}$$

Note that the phase information of the squared signal at A 712 and the signal at C 714 correspond to the phases of the fundamental and the harmonic observable from the DFT (e.g., FFT) of the digital output signal. When comparing the phase of squared signal at A 712 and the phase of signal at C 714, Equation 13 is subtracted by Equation 14:

$$2\angle H_{DAC}(j\omega_c) + 2\angle H_{LIN}(j\omega_c) - (2\angle H_{DAC}(j\omega_c) + \angle H_2(j2\omega_c)) = 2\angle H_{LIN}(j\omega_c) - \angle H_2(j2\omega_c) \quad \text{(eq. 15)}$$

In Equation 15, it can be seen that $\angle H_{DAC}(j\omega_c)$ term drops out through the subtraction. Accordingly, the estimation does not depend on $h_{DAC}(t)$ 702. The phase of the correction filter at $2\omega_c$ can be set to the expression in Equation 15.

Using Wideband Signals as a Test Signal

Figure 8:
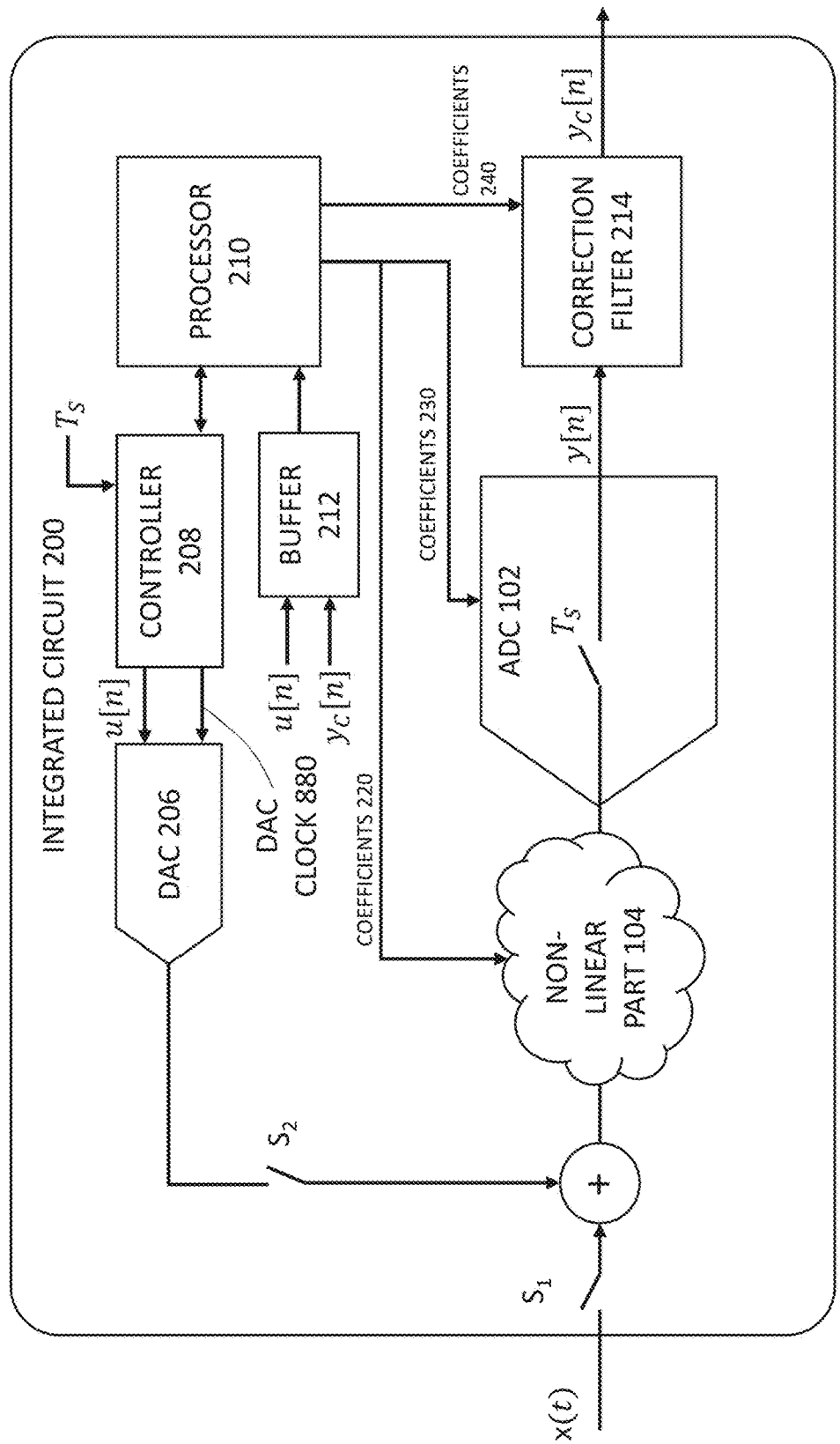
FIG. 8 illustrates another exemplary integrated circuit having on-chip signal path linearization, according to some embodiments of the disclosure.

Wideband signals can be injected as a test signal to exercise the signal chain and measure its non-linearities. FIG. 8 illustrates another exemplary integrated circuit having on-chip signal path linearization, according to some embodiments of the disclosure. The controller 208 is a pseudo-random number generator and controls the digital-to-analog converter 206 to generate a wideband signal spread across a range of frequencies. Specifically, the controller 208 can generate a pseudo-random number sequence u[n] and provide u[n] as input to DAC 206. u[n] can be digital number sequence that has a uniform, white frequency response across, e.g., a first Nyquist zone. The DAC 206 would then output the pseudo-random number sequence in analog form as the test signal being injected into the signal path. Advantageously, since the DAC 206 is on-chip with the ADC 102, the DAC clock 880 can come from the same clock driving the ADC 106 (ADC sampling clock). The signal path generates digital output signal y[n] based on the test signal. The error signal e[n] is formed based on y[n], or the corrected digital output signal $y_c$[n] for an adaptive scheme. For instance, e[n]=u[n]−$y_c$[n]. Non-linearities of the non-linear part 104 can be extracted from the error signal e[n]. To generate e[n], buffer 212 can receive u[n] and $y_c$[n], and subtracts u[n] by $y_c$[n] to obtain e[n]. The processor 210 can estimate the non-linearities based on e[n] and y[n], e.g., through correlations between e[n] and y[n]. It is possible to alternatively apply correction to u[n] to form $u_c$[n], and the error signal e[n] can be obtained by subtracting y[n] by $u_c$[n] (i.e., e[n]=y[n]−$u_c$[n]). The processor 210 can estimate the non-linearities based on u[n] and e[n], e.g., through correlations between e[n] and u[n]. For instance, coefficients for correcting the second order and third order non-linearities (HD2 and HD3 coefficients) can be estimated Least Squares (LS) or Least-Means Squares (LMS) type correlations. For robustness, orthogonal polynomials or other methods can be used. For example, HD2 coefficients can be estimated from the exemplary set of M linear equations below, formed from data sets of length N:

$$\begin{bmatrix} \widehat{h_{r_2}}[0] \\ \widehat{h_{r_2}}[1] \\ \ldots \\ \widehat{h_{r_2}}[M-1] \end{bmatrix} = \quad \text{(eq. 16)}$$

-continued $$\begin{bmatrix} u^2[0] & u^2[1] & \ldots & u^2[N-1] \\ u^2[1] & u^2[2] & \ldots & u^2[N] \\ \ldots & \ldots & \ldots & \ldots \\ u^2[M-1] & \ldots & \ldots & u^2[N+M-1] \end{bmatrix} \begin{bmatrix} e[0] \\ e[1] \\ \ldots \\ e[N-1] \end{bmatrix}$$

(eq. 17)

$$\begin{bmatrix} \widehat{h_{p_2}}[0] \\ \widehat{h_{p_2}}[1] \\ \ldots \\ \widehat{h_{p_2}}[M-1] \end{bmatrix} = $$

$$\begin{bmatrix} \frac{1}{2}(3u^2[0]-1) & \frac{1}{2}(3u^2[1]-1) & \ldots & \frac{1}{2}(3u^2[N-1]-1) \\ \frac{1}{2}(3u^2[1]-1) & \frac{1}{2}(3u^2[2]-1) & \ldots & \frac{1}{2}(3u^2[N]-1) \\ \ldots & \ldots & \ldots & \ldots \\ \frac{1}{2}(3u^2[M-1]-1) & \ldots & \ldots & \frac{1}{2}(3u^2[N+M-1]-1) \end{bmatrix}$$

$$\begin{bmatrix} e[0] \\ e[1] \\ \ldots \\ e[N-1] \end{bmatrix}$$

(eq. 18)

$$\begin{bmatrix} \widehat{h_{p_2}}[0] \\ \widehat{h_{p_2}}[1] \\ \ldots \\ \widehat{h_{p_2}}[M-1] \end{bmatrix} = $$

$$\begin{bmatrix} u_0[0]u_1[0] & u_0[1]u_1[1] & \ldots & u_0[N-1]u_1[N-1] \\ u_0[1]u_1[1] & u_0[2]u_1[2] & \ldots & u_0[N]u_1[N] \\ \ldots & \ldots & \ldots & \ldots \\ u_0[M-1]u_1[M-1] & \ldots & \ldots & u_0[N+M-1]u_1[N+M-1] \end{bmatrix}$$

$$\begin{bmatrix} e[0] \\ e[1] \\ \ldots \\ e[N-1] \end{bmatrix}$$

Equation 16 is an example of linear equations based on LS or LMS type correlations. Equation 17 is an example of linear equations based on orthogonal polynomials. Equation 18 is an example of linear equations based on product of bits. As illustrated in Equations 16-18, the correlations are done between e[n] and u[n]. If the correlations are being performed between e[n] and y[n], the same set of linear equations can be used once u[n] is replaced with y[n].

Time-Delayed Interleaving

One consideration in using a wideband signal as a test signal is that the second order harmonic HD2 has up to two-times (2×), and third order harmonic HD3 has up to three-times (3×), the bandwidth of the ADC 106, assuming that the DAC 206 is running at the same rate as the ADC 106. When estimating HD2 and HD3 correction coefficients at the ADC sampling rate (1×) using adaptive filtering methods (e.g. LS or LMS), the coefficients will converge to best correct the folded spectrum, after HD2 and HD3 have aliased. This is not ideal if HD2 and HD3 vary over frequency and over different Nyquist zones. To properly correct for HD2 and HD3 the ADC output can be first interpolated to, e.g., 4× rate, the HD2 and HD3 correction filter applied, and then the data is downsampled (without filtering) back to the 1× rate. Since the correction filter operates at the 4× rate, the adaptive filtering is ideally be performed at the 4× rate as well. In other words, the ADC digital output data can be generated at the higher rate (e.g., 4× rate), and the correction can also occur at the same higher rate (e.g., 4× rate). Generally speaking, the higher rate should be equal to or higher than 3× the ADC rate, if the linearization scheme aims to address at least the second and third harmonics.

Figure 9:
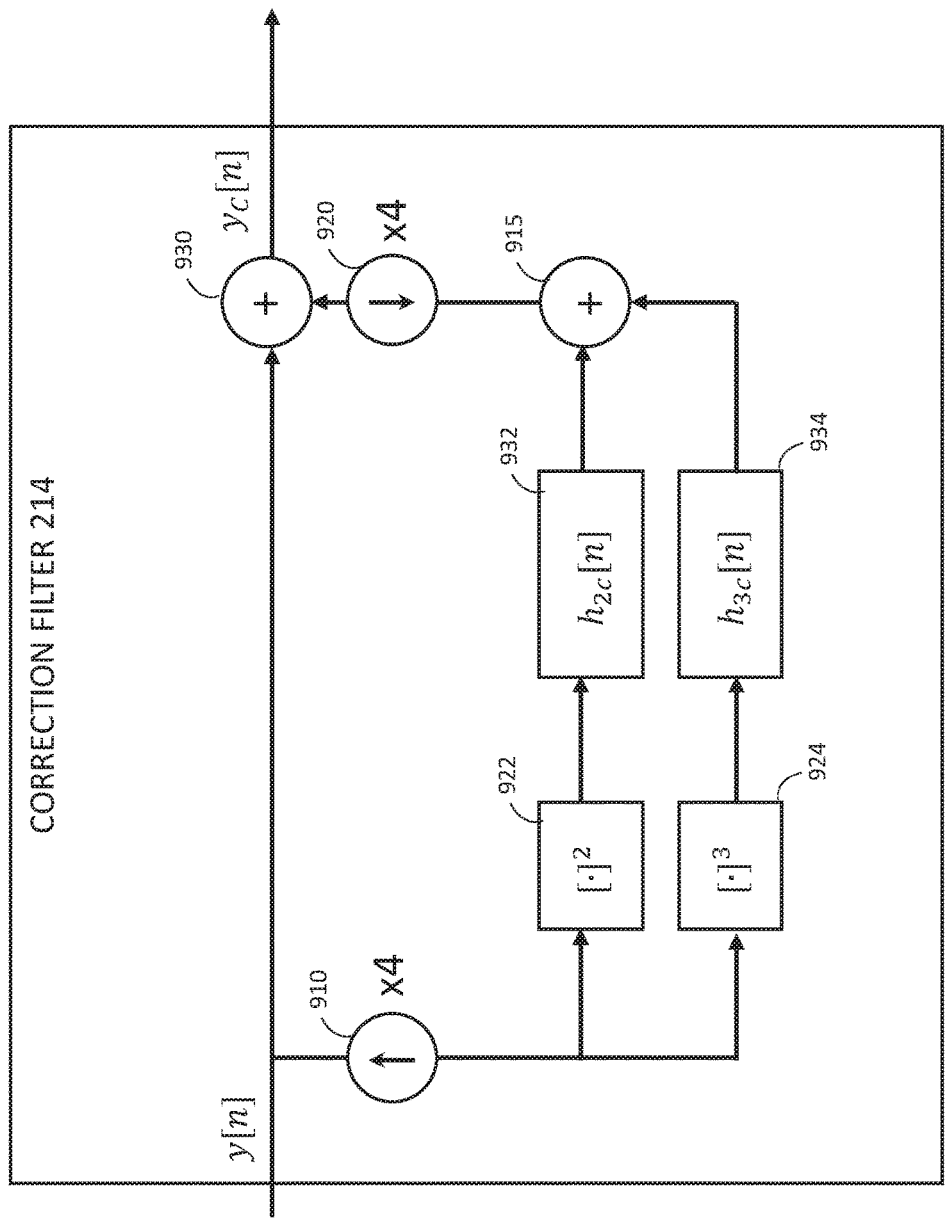
FIG. 9 illustrates a correction scheme involving interpolation, according to some embodiments of the disclosure.

To perform correction at the higher rate can be performed through upsampling, downsampling, and using coefficients which are generated at the higher rate. FIG. 9 illustrates a correction scheme involving interpolation, according to some embodiments of the disclosure. For illustration, the correction filter 214 as shown performs non-linear calibration (similar to the example shown in FIG. 3). Other suitable filtering schemes or structures are envisioned by the disclosure. The correction filter 214 has are three parallel branches: the first order branch, the second order branch, and the third order branch. Prior to filtering through function blocks 922 and 924, and filters 932 and 934, the digital output signal y[n] is upsampled/interpolated by 4× by interpolator 910. The outputs of the second order branch and the third order branch are summed/combined by summation node 915. The combined output of the second order branch and the third order branch is downsampled by 4× by downsampler 920. The first order branch and the downsampled combined output of the second order and third order branches are summed by summation node 930 to form yc[n]. The resulting correction filter 214 can perform correction at the 4× rate, using coefficients generated at the 4× rate.

To estimate coefficients for the correction filter at the 4× rate is not trivial. Ideally, the ADC could be run at, e.g. the 4× rate, for training the coefficients, and then the coefficients could be applied to the ADC running at the normal 1× rate (after interpolating by 4×). To avoid running the ADC at, e.g., the 4× rate, one possible approach is to enable the ADC to sample at an effective 4× rate by time-delayed interleaving. Taking advantage of a foreground calibration environment and a closed system having the DAC 206 on-chip with the signal chain, it is possible to generate digital output data of the signal chain at the higher rate (e.g., 4×) without having to run the on-chip DAC at 4× of the ADC rate. Time-delayed interleaving for the calibration scheme means the calibration scheme can (1) run the same test signal sequence u[n] through the on-chip DAC, (2) inject the same test signal from the on-chip DAC through the ADC multiple times (e.g., four times), with multiple equally-spaced clock phases (e.g., four 90 degrees phase shifted clocks with respect to the ADC clock), (3) interleave the digital output data generated from running the same test signal at the higher (e.g., 4×) rate in the buffer, and (4) perform coefficient estimation using the time-delayed interleaved data in the buffer. While some of the examples of time-delayed interleaving herein obtain digital output data at the 4× rate, it is understood that other higher rate digital output data can be obtained in a similar manner.

Figure 10:
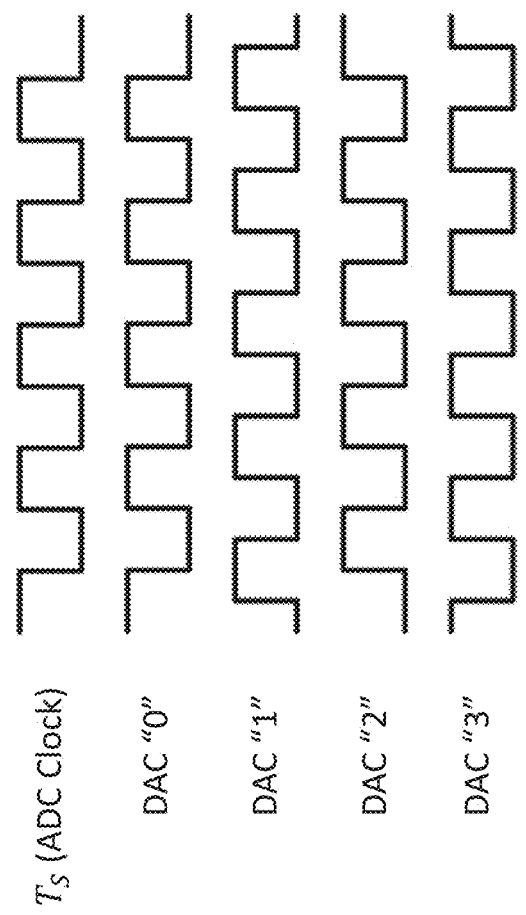
FIG. 10 illustrates a time-delayed interleaving clocking scheme for the ADC and the digital-to-analog converter to generate interpolated data, according to some embodiments of the disclosure.

Accordingly, the method for linearizing the signal path can include repeating, by a signal generator (e.g., an on-chip controller driving an on-chip DAC), a test sequence being injected into the signal path over multiple time periods. For each time period, the signal generator is clocked using clock signals shifted by different amounts (e.g., clock signals whose phases are equally-spaced across 360 degrees). FIG. 10 illustrates a time-delayed interleaving clocking scheme for the ADC and the DAC to generate interpolated data, according to some embodiments of the disclosure. With the given ADC clock shown as "$T_s$", the example shows four different clock signals, e.g., DAC "0", DAC "1", DAC "2", and DAC "3", which are phased shifted by 90 degrees. The amount of phase shift can depend on the interleaving multiplier of the time-delayed interleaving scheme (e.g., degrees of phase shift is generally equal to 360 degrees divided by the interleaving multiplier). The data captured from the signal path from the multiple time periods are interleaved in a buffer. An error of the signal path (e.g., e[n]) can be determined from the interleaved data interleaved in the buffer.

Interleaving data in the buffer means that the data can be stored in interleaved memory locations in the buffer. For a first sequence of data, the data points can be stored at every $4^{th}$ memory location (e.g., memory locations 0, 4, 8). For a subsequent sequence of data generated from the next phase shifted clock, the data points are stored at every $4^{th}$ location shifted by one location from the locations used for storing the previous sequence of data (e.g., memory locations 1, 5, 9, . . . ). Time-delayed interleaving effectively forms the 4× data without having to run the on-chip DAC at 4× the ADC rate. Though time-delayed interleaving, the on-chip DAC runs at an effective rate of 4× the ADC rate using the phase shifted clocks (without actually running/clocking the on-chip DAC at the 4× rate).

In one example, take a wideband (uniform, white) DAC input sequence u[n] of length N. Referring back to FIG. 8, the controller 208 provides a same digital input signal during a first period and a second period. The controller 208, during the first period, generates a first clock signal (e.g., DAC "0" of FIG. 10) for the DAC 206 which is in phase with a clock signal driving the ADC 102 (e.g., "$T_s$" of FIG. 10). During the second period, the controller 208 generates a second clock signal (e.g., DAC "1" of FIG. 10) for the digital-to-analog converter which is out of phase with the clock signal driving the ADC 102 (e.g., "$T_s$" of FIG. 10). During the first period, values of the digital output signal (e.g., y[n]) is captured while the DAC clock 880 is aligned with ADC clock. During the second period, for the same sequence u[n], values of the digital output signal (e.g., y[n]) is captured while the DAC clock 880 is 90 degrees phase shifted. The same can be repeated for DAC clock shifts of 180 and 270 degrees (e.g., DAC "0" and DAC "1" of FIG. 10) during a third and fourth period respectively. The buffer 212 can interleave values of the digital output signal captured during the first period, the values of the digital output signal captured during the second period, the values of the digital output signal captured during the third period, and the values of the digital output signal captured during the fourth period.

Figure 11:
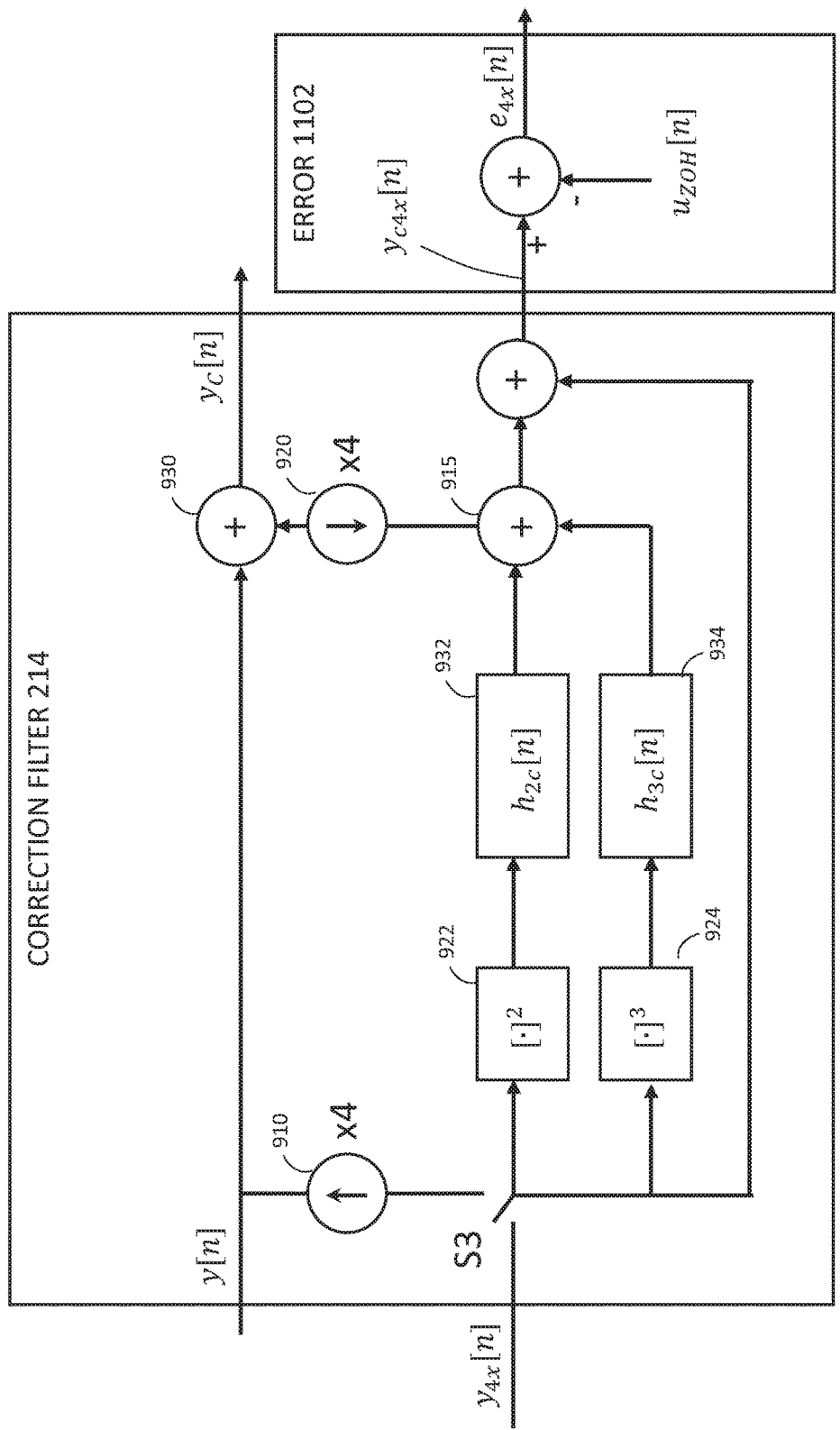
FIG. 11 illustrates an exemplary data path for calibration using the data generated by the clocking scheme of FIG. 10, according to some embodiments of the disclosure.

The interleaving scheme and ADC 102 effectively captured the DAC signal u[n] at the 4× rate, forming interleaved data $y_{4x}[n]$. Coefficient estimation can then occur at the 4× rate. FIG. 11 illustrates an exemplary data path for calibration using the data generated by the clocking scheme of FIG. 10, according to some embodiments of the disclosure. The buffer can interleave the data captured during four periods to form $y_{4x}[n]$. When S3 is switched to calibration mode, interleaved data $y_{4x}[n]$ is fed from the buffer to correction filter 214 to the branches in the correction filter. The correction filter generates corrected digital output signal $y_{c4x}[n]$. Assuming u[n] has a zeroth-order hold behavior, u[n] is interpolated to generate $u_{ZOH}[n]$. Error block 1102 (which can be part of the buffer 212 of FIG. 8) can then use the interpolated DAC input sequence $u_{ZOH}[n]$ and interleaved values captured during the different periods $y_{4x}[n]$ to determine the error data $e_{4x}[n]$.

Modifying coefficient estimation at the 4× rate, and assuming zeroth-order hold behavior where $u_{ZOH}^2[0]=u_{ZOH}^2[1]=u_{ZOH}^2[2]=u_{ZOH}^2[3]$, one exemplary set of equations for determining HD2 coefficients can have the following formulation:

$$\begin{bmatrix} \bar{h}_{P2}[0] \\ \bar{h}_{P2}[1] \\ \ldots \\ \bar{h}_{P2}[M-1] \end{bmatrix} = \quad \text{(eq. 19)}$$

$$\begin{bmatrix} u_{ZOH}^2[0] & u_{ZOH}^2[1] & \ldots & u_{ZOH}^2[N-1] \\ u_{ZOH}^2[1] & u_{ZOH}^2[2] & \ldots & u_{ZOH}^2[N] \\ \ldots & \ldots & \ldots & \ldots \\ u_{ZOH}^2[M-1] & \ldots & \ldots & u_{ZOH}^2[N+M-1] \end{bmatrix} \begin{bmatrix} e_{4X}[0] \\ e_{4X}[1] \\ \ldots \\ e_{4X}[N-1] \end{bmatrix}$$

Alternative Models for Non-Linearities

Figure 12:
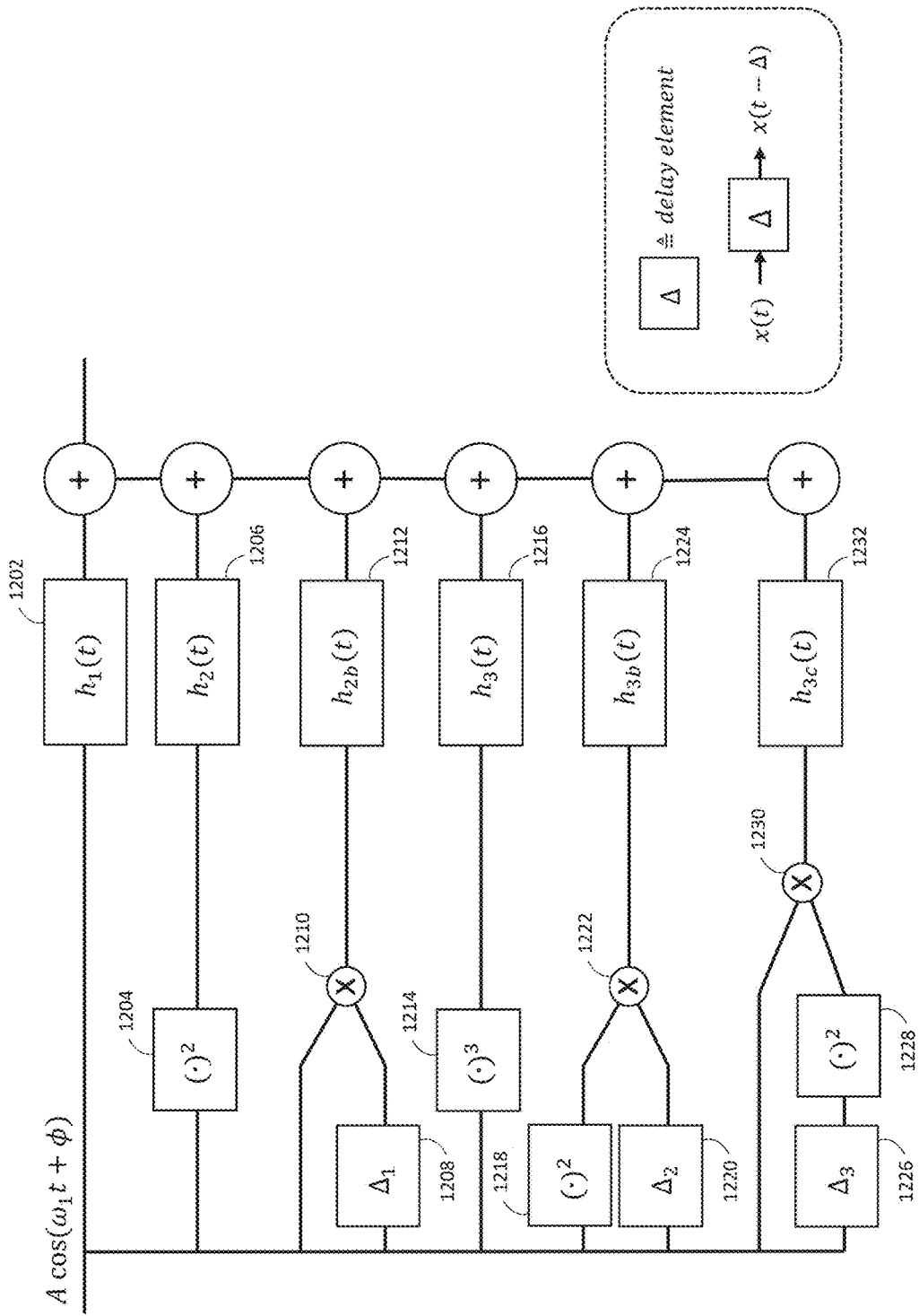
FIG. 12 illustrates an exemplary model of the non-linearities of a signal path, according to some embodiments of the disclosure.
Figure 13:
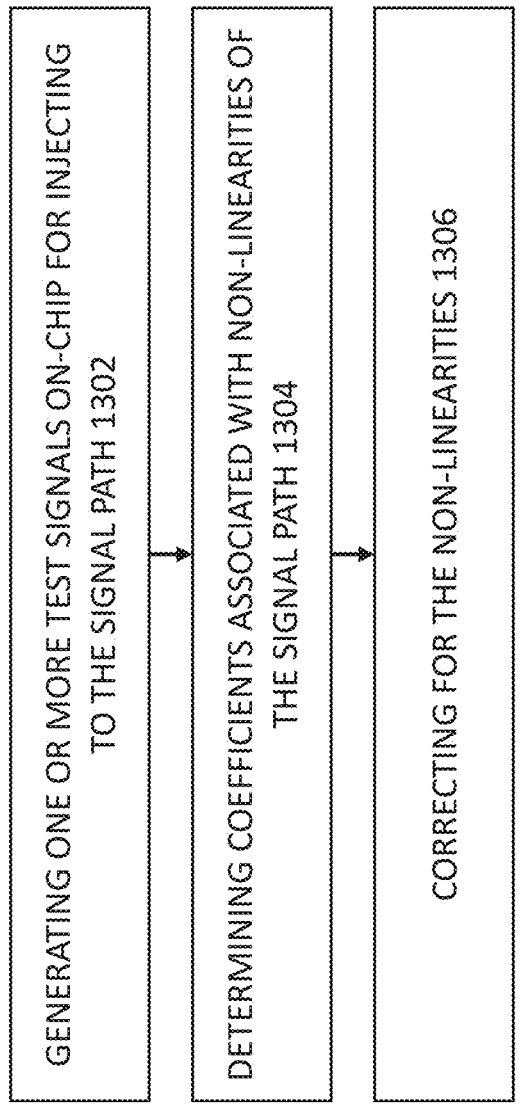
FIG. 13 is a flow diagram illustrating a method for linearization, according to some embodiments of the disclosure.

Besides the example shown in FIGS. 1 and 6, other models can be used to model the non-linearities, including some models which may be able to more efficiently model dynamic (memory) non-linearities. While the examples in FIGS. 1 and 6 can correct for both static (memoryless) and dynamic non-linearities, the correction filters may have many taps. By modeling the non-linearities differently, e.g., with a different set of branches (or terms), it is possible to design correction filters that can be implemented with fewer taps (which can make the correction mechanism more efficient). FIG. 12 illustrates an exemplary model of the non-linearities of a signal path, according to some embodiments of the disclosure. One skilled in the art would understand that this model is only shown as an example. The exemplary model has more complex branches which are summed/combined together by summation nodes, and the branches yields HD2 and HD3 differently from the model seen in FIGS. 1 and 6. The first order branch has $h_1(t)$ in block 1202. The model for HD2 can include two terms. The first term is generated by a $2^{nd}$ order power static non-linear function seen as $(\bullet)^2$ in block 1204 and linear filter $h_2(t)$ in block 1206. The second term (cross term) is generated by multiplying (by multiplier 1210) the input and a delayed version of the input (through delay element 1208) and filtering the product by the linear filter $h_{2b}(t)$ in block 1212. The model for HD3 can include three terms. The first term is generated by the $3^{rd}$ order power static non-linear function seen as $(\bullet)^3$ in block 1214 and linear filter $h_3(t)$ in block 1206. The second term (cross term) is generated by multiplying (by multiplier 1222) the input through $2^{nd}$ order power static non-linear function seen as $(\bullet)^2$ in block 1218 and a delayed version of the input (through delay element 1220) and filtering the product by the linear filter $h_{3b}(t)$ in block 1224. The third term (cross term) is generated by delaying the input (through delay element 1226), passing the delayed input through a $2^{nd}$ order power static non-linear function seen as $(\bullet)^2$ in block 1228, multiplying (by multiplier 1230) the input and the result from block 1228, and filtering the product by the linear filter $h_{3c}(t)$ in block 1232. One skilled in the art would appreciate that variations to the model shown can be used. The delays in the delay elements 1208, 1220, and 1226 do not necessarily have the same amount of delay.

The technical task is to understand the relationship of the observed fundamental and HD2 in the output FFT, and deriving the coefficients for HD2 appropriately from the observed fundamental and HD2 based on the model (i.e., by relating/comparing the observed fundamental and HD2 appropriately). Another part of the task is to locate the fundamental and the HD2 in the output FFT for proper analysis. Due to the delay elements 1208, 1220, and 1226 of the model, the analysis on the output FFT would need to take into account any phase that had been introduced by the delay elements 1208, 1220, and 1226 appearing in the output FFT. Besides coefficients for filters correcting HD2, coefficients associated with other filters correcting other non-linear components can also be determined in a similar fashion. Consider the path having $h_1(t)$ in block 1202 and the path having $h_{2b}(t)$ in block 1212 in the model. To derive coefficients for $h_{2b}(t)$ (part of HD2), the comparison would be made between the signal at the output of the multiplier 1210 ("correcting signal") and the signal at the output of $h_{2b}(t)$ in block 1212. The "correcting signal" is the product of the observed fundamental and the observed fundamental delayed by $\Delta$. Specifically, the comparison would involve determining the magnitude and phase information of the correcting signal and the signal at the output of $h_{2b}(t)$ in block 1212 from an output FFT, and comparing the magnitude and phase information of the correcting signal and the signal at the output of $h_{2b}(t)$ in block 1212 to obtain the magnitude response and phase response of a correction filter for HD2 (e.g., $h_{2b}[n]$).

An input $A\cos(\omega_1 t+\phi)$ going through the path having $h_1(t)$ in block 1202 would result in:

$$A|H_1(\omega_1)|\cos(\omega_1 t+\phi+\angle H_1(\omega_1)) \qquad \text{(eq. 20)}$$

The signal seen from Equation 20 would be observable in the FFT as the fundamental. The input $A\cos(\omega_1 t+\phi)$ going through the path having $h_{2b}(t)$ in block 1212 would involve $A\cos(\omega_1 t+\phi) \cdot A\cos(\omega_1 t+\phi+\phi_2)$, where $\phi_2=\omega_1*\Delta$, going through $h_{2b}(t)$ in block 1212. $A\cos(\omega_1 t+\phi)$ is the tonal input, and $A\cos(\omega_1 t+\phi+\phi_2)$ is the delayed tonal input of delay $\Delta$.

$$\Delta = \frac{T_s}{4}$$

if the correction upsample rate is 4×. $\Delta$ represents the time scale at which non-linearities can be observed. If the correction upsample rate is different, $\Delta$ would change. The result of the path having $h_{2b}(t)$ in block 1212 is thus:

$$\tfrac{1}{2}A^2|H_2(\omega_1)|\cos(2\omega_1 t+2\phi+\phi_2+\angle H_{2b}(\omega_1)) \qquad \text{(eq. 21)}$$

The correction filter mirrors what is shown in FIG. 12, and digitized HD2 would be corrected with a product of the digitized version of the result in Equation 20 $A|H_1(\omega_1)|\cos(\omega_1 t+\phi+\angle H_1(\omega_1))$ and delayed version of the result in Equation 20 $A|H_1(\omega_1)|\cos(\omega_1 t+\phi+\phi_2+\angle H_1(\omega_1))$. Correction is performed on the product (i.e., referred herein as the correcting signal), by a digital filter $h_{2b}[n]$. The digital filter $h_{2b}[n]$ can be obtained from the information extracted using the method described below, which involves comparing the observable HD2 and the correcting signal.

For the sake of simplicity, the following correction equations are kept in continuous-time to match up with the formulations above, but it is understood that the correction is done in the discrete-time (digital) domain, and the equations would be represented in discrete-time. The product would be:

$$A|H_1(\omega_1)|\cos(\omega_1 t+\phi+\angle H_1(\omega_1)) \cdot A|H_1(\omega_1)|\cos(w_1 t+\phi+\phi_2+\angle H_1(\omega_1))=\tfrac{1}{2}A^2|H_1(\omega_1)|^2\cos(2\omega_1 t+2\phi+\phi_2+2\angle H_1(\omega_1)) \qquad \text{(eq. 22)}$$

When examining the FFT of the ADC output, one can observe an FFT bin with fundamental (corresponding to Equation 20): $A|H_1(\omega_1)|\cos(\omega_1 t+\phi+\angle H_1(\omega_1))$. One can also observe an HD2 bin with (corresponding to Equation 21): $\tfrac{1}{2}A^2|H_2(\omega_2)|\cos(2\omega_1 t+2\phi+\phi_2+\angle H_{2b}(\omega_2))$. The HD2 can be corrected with the correcting signal (corresponding to Equation 22): $\tfrac{1}{2}A^2|H_1(\omega_1)|^2\cos(2\omega_1 t+2\phi+\phi_2+2\angle H_1(\omega_1))$. Understanding the relationship between Equation 21 (observable HD2) and Equation 22 (the correcting signal) would yield information about $h_{2b}(t)$, i.e., coefficients associated with HD2.

Since the delay in $\phi_2$ is due to $$\frac{T_s}{4},$$

it is possible to calculate and determine $\phi_2$ $$\left(\phi_2 = \omega_1 * \frac{T_s}{4}\right)$$

since $\omega_1$ is known. The phase of the fundamental can be doubled to obtain $2\phi+2\angle H_1(\omega_1)$. To this calculated phase $2\phi+2\angle H_1(\omega_1)$, it is possible to add the calculated $\phi_2$. The result is the correcting signal that can be used for correcting HD2 (which is at $2\phi+\phi_2+2\angle H_1(\omega_1)$ or equivalently $2\phi+2\angle H_1(\omega_1)+\phi_2$ from Equation 22). Once the phase of the correcting signal at $2\phi+\phi_2+2\angle H_1(\omega_1)$ (based on Equation 22) is determined, it is possible to determine information associated with $h_{2b}(t)$ by relating Equation 22 (the correcting signal having the fundamental and the delayed fundamental) and Equation 21 (the observable HD2), i.e., in a manner similar to the scheme described in FIG. 6). Accordingly, the relationship of Equation 22 and Equation 21 would yield coefficients for correction filter $h_{2b}[n]$ associated with HD2. Advantageously, the filter $h_{2b}[n]$ to correct for $h_{2b}(t)$ can be a filter with a small number of taps. Such a calibration scheme can better characterize dynamic (memory) non-linearities and correct for such non-linearities more effectively or efficiently than the model seen in FIG. 1.

The above described scheme continues to compare or relate the fundamental with the non-linear components present in the output. However, depending on the model and the non-linear component to be extracted, the "correcting signal" being used for the comparison or relationship, or the way to form the "correcting signal" would differ. For instance, the "correcting signal" to be used to derive $h_{3b}(t)$ in block 1224 would be formed differently.

Examples

Example 1 is an integrated circuit having on-chip signal path linearization, the integrated circuit comprising: a digital-to-analog converter for generating one or more test signals; a controller for providing a digital input signal to the digital-to-analog converter; an analog-to-digital converter for receiving the one or more test signals provided to a signal path and converting the one or more test signals to a digital output signal; and a processor for estimating coefficients corresponding to non-linearities of the signal path based the digital output signal.

In Example 2, the integrated circuit of Example 1 can further include: a first switch for disconnecting the signal path from receiving an external analog input during a calibration phase; and a second switch for coupling an analog output of the digital-to-analog converter to the signal path during the calibration phase.

In Example 3, the integrated circuit of Example 1 or 2 can further include: the controller controlling the digital-to-analog converter to generate single-tone signals as the one or more test signals.

In Example 4, the integrated circuit of any one of Examples 1-3 can further include: the controller controlling the digital-to-analog converter to generate multi-tone signals as the one or more test signals.

In Example 5, the integrated circuit of any one of Examples 1-4 can further include: the one or more test signals comprising tones having respective frequencies across a Nyquist zone of the analog-to-digital converter.

In Example 6, the integrated circuit of any one of Examples 1-5 can further include: the processor estimating the coefficients by relating a fundamental and a non-linear component in the digital output signal.

In Example 7, the integrated circuit of any one of Examples 1-6 can further include: the controller being a pseudo-random number generator and controlling the digital-to-analog converter to generate a wideband signal spread across a range of frequencies.

In Example 8, the integrated circuit of any one of Examples 1-7 can further include: a buffer for capturing values of the digital output signal and/or values of a corrected digital output signal.

In Example 9, the integrated circuit of any one of Examples 1-8 can further include: the controller providing a same digital input signal during a first period and a second period; and the controller, during the first period, generating a first clock signal for the digital-to-analog converter which is in phase with a clock signal driving the analog-to-digital converter, and during the second period, generating a second clock signal for the digital-to-analog converter which is out of phase with the clock signal driving the analog-to-digital converter.

In Example 10, the integrated circuit of any one of Examples 1-9 can further include: the buffer interleaving values of the digital output signal captured during the first period and values of the digital output signal captured during the second period.

Example 11 is a method for linearizing a signal path having an analog-to-digital converter, the method comprising: generating, by a digital-to-analog converter on-chip with the analog-to-digital converter, one or more test signals for injecting to the signal path; determining coefficients associated with non-linearities of the signal path based on values of a digital output signal of the signal path, wherein the digital output signal is based on an output generated by the analog-to-digital converter from the one or more test signals; and correcting for the non-linearities of the signal path using the coefficients.

In Example 12, the method of Example 11 can further include: generating the one or more test signals comprising generating one or more: single-tone signal, multi-tone signal, and pseudo-random signal.

In Example 13, the method of Example 11 or 12 can further include: capturing values of the digital output signal of the signal path and/or values of a corrected digital output signal in a buffer, said digital output signal generated from the one or more test signals.

In Example 14, the method of any one of Examples 11-13 can further include: determining coefficients comprising relating magnitude and phase of a fundamental in the digital output signal and magnitude and phase of a non-linear component in the digital output signal.

In Example 15, the method of any one of Examples 11-14 can further include: providing a same test sequence as input to the digital-to-analog converter to inject a same test signal to the signal path during a first time period and a second time period; and clocking the digital-to-analog converter using a first clock signal during the first time period and a second clock signal having different phases with respect to a clock signal driving the analog-to-digital converter with the first clock signal.

In Example 16, the method of any one of Examples 11-15 can further include: storing values of the digital output signal or data derived from the values of the digital output signal captured during a first phase and values of the digital output signal captured or data derived from the values of the digital output signal captured during a second phase in an interleaved manner in a buffer.

In Example 17, the method of any one of Examples 11-16 can further include: disconnecting the signal path from receiving an external analog input during a calibration phase; and coupling an analog output of the digital-to-analog converter to the signal path during the calibration phase.

In Example 18, the method of any one of Examples 11-17 can further include correcting for the non-linearities comprising: writing coefficients to digital filters; and filtering, by the digital filters, the digital output signal of the analog-to-digital converter.

In Example 19, the method of any one of Examples 11-18 can further include correcting for the non-linearities comprising: tuning circuitry in the signal path based on the coefficients.

Example 20 is a method for linearizing a signal path, the method comprising: repeating, by a signal generator, a test sequence being injected into the signal path over multiple time periods; clocking the signal generator using clock signals shifted by different amounts for each time period; interleaving data captured from the signal path from the multiple time periods in a buffer; and determining an error of the signal path from the interleaved data.

Example 21 is an apparatus for performing any one of the methods in Examples 11-20.

Variations and Implementations

The embodiments described herein may seem similar to digital pre-distortion schemes to achieve linearity of a signal chain, but, the embodiments described herein for linearization are distinguishable from such schemes. Digital pre-distortion schemes pre-distort digital data that is being used to drive a signal chain to achieve linearity. These schemes typically would have knowledge of the input data into the signal chain (i.e., digital data as input to the signal chain), and pre-distort it based on an inverse of non-linear functions of the signal chain to achieve linearity. In contrast, the embodiments described herein do not assume that there is any knowledge of the input signal (e.g., typically an unknown analog input signal being fed as input to the signal chain). Moreover, the embodiments described herein offer digital correction or analog tuning to correct and address the non-linearities of the signal chain, which is not the same as pre-distorting a digital signal.

ADCs can be found in many places such as broadband communication systems, audio systems, receiver systems, etc. ADCs can translate analog electrical signals representing real-world phenomenon, e.g., light, sound, temperature or pressure for data processing purposes. Designing an ADC is a non-trivial task because each application may have different needs in performance, power, cost and size. ADCs are used in a broad range of applications including communications, energy, healthcare, instrumentation and measurement, motor and power control, industrial automation and aerospace/defense.

The present disclosure describes many embodiments related to providing circuitry which are on-chip with the ADC. On-chip can mean that the circuitry and the ADC are on the same semiconductor substrate. In some cases, the circuitry and the ADC are vertically integrated together where different parts of the integrated circuit are provide on different sides or on different layers of a vertically integrated circuit with a through-silicon via (TSV) connecting the different parts. In some embodiments, the circuitry is provided with the same package as the ADC, but not necessarily on the same semiconductor substrate. Note that particular embodiments of the present disclosure may be readily included in a system on-chip (SOC) package, either in part, or in whole. An SOC represents an IC that integrates components of a computer or other electronic system into a single chip. It may contain digital, analog, mixed-signal, and converter functions (or some other desired functions): all of which may be provided on a single chip substrate. Other embodiments may include a multi-chip-module (MCM), with a plurality of separate ICs located within a single electronic package and configured to interact closely with each other through the electronic package. In some embodiments, the processor is off-chip.

While many examples describe using an on-chip DAC to generate one or more test signals, it is understood that in some cases an on-chip signal generator can be used to generate such test signals. For example, an on-chip oscillator can be used to generate tones.

The chip may be programmed with pre-determined coefficients for the digital filters for linearizing the signal chain, where the pre-determined coefficients are determined with a tester. After the chip is shipped, the linearization scheme can run to update the pre-determined coefficients.

In certain contexts, the features discussed herein can be applicable to converters being used in many different applications. The features described herein are particularly applicable to systems where linearity is important. Various exemplary applications include medical systems, scientific instrumentation, transportation systems, aerospace systems, wireless and wired communications, radar, industrial process control, audio and video equipment, consumer devices, and other converter-based systems.

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

Parts of various apparatuses for linearization can include electronic circuitry to perform the functions described herein. In some cases, one or more parts of the apparatus can be provided by an on-chip processor or controller specially configured for carrying out the functions described herein. For instance, the on-chip processor or controller may include one or more application specific components, or may include programmable logic gates which are configured to carry out the functions describe herein. The circuitry can operate in analog domain, digital domain, or in a mixed-signal domain (but preferably in the digital domain). In some instances, the processor or controller may be configured to carrying out the functions described herein by executing one or more instructions stored on a non-transitory computer medium accessible by the on-chip processor or controller.

In one example embodiment, the chip (or integrated circuit) providing the converter and the on-chip processor may be provided on a board of an associated electronic device. The board can be a general circuit board that can hold various components of the internal electronic system of the electronic device and, further, provide connectors for other peripherals. For instance, the chip having the converter and the on-chip processor can communicate with the components of the associated electronic device (e.g., signal generators, processors, memory, transmitters, receivers, etc.). More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the examples and appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the examples and appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the linearization functions, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

What is claimed is:

1. An integrated circuit having on-chip signal path linearization, the integrated circuit comprising:
   a digital-to-analog converter for generating test signals;
   a controller for providing a digital input signal to the digital-to-analog converter;
   an analog-to-digital converter for receiving the test signals provided to a signal path and converting the test signals to a digital output signal; and
   a processor for estimating coefficients corresponding to non-idealities of the signal path based the digital output signal resulting from the test signals;
   wherein the test signals comprises tonal inputs having respective frequencies sweeping across one or more Nyquist zones of the analog-to-digital converter.

2. The integrated circuit of claim 1, further comprising:
   a first switch for disconnecting the signal path from receiving an external analog input during a calibration phase; and
   a second switch for coupling an analog output of the digital-to-analog converter to the signal path during the calibration phase.

3. The integrated circuit of claim 1, wherein the controller controls the digital-to-analog converter to generate single-tone signals as the test signals.

4. The integrated circuit of claim 1, wherein the controller controls the digital-to-analog converter to generate multi-tone signals as the test signals.

5. The integrated circuit of claim 1, wherein:
   the respective frequencies are equally-spaced across the one or more Nyquist zones.

6. The integrated circuit of claim 1, wherein:
   the tonal inputs comprises a number of equally-spaced tones;
   the digital output signal comprises a number of data sets generated from providing the equally-spaced tones to the signal path; and
   the processor estimates the coefficients by relating a fundamental and a non-linear component in each one of the data sets and reconstructing a response corresponding to the non-idealities based on relationships between the fundamental and the non-linear component in each data set.

7. The integrated circuit of claim 1, wherein the processor comprises digital hardware to implement some functions of the processor.

8. The integrated circuit of claim 1, further comprising:
   a summing node to allow test signals to be injected into the signal path.

9. The integrated circuit of claim 1, wherein:
   the digital output signal comprises a number of data sets generated from injecting tones to the signal path; and
   the processor estimates the coefficients by relating a fundamental and a non-linear component in each one of the data sets.

10. The integrated circuit of claim 1, wherein the digital-to-analog converter is provided in a same package as the analog-to-digital converter but not on a same semiconductor substrate as the analog-to-digital converter.

11. An integrated circuit having on-chip signal path linearization, the integrated circuit comprising:
   a digital-to-analog converter;
   a controller for providing a digital input signal to the digital-to-analog converter, wherein:
      the controller comprises a pseudo-random number generator to generate the digital input signal; and
      the controller controls the digital-to-analog converter to generate test signals comprising a wideband signal having a uniform, white frequency response across a range of frequencies;
   an analog-to-digital converter for receiving the test signals provided to a signal path and converting the test signals to a digital output signal; and
   a processor for estimating coefficients corresponding to non-idealities of the signal path based the digital output signal resulting from the test signals.

12. The integrated circuit of claim 11, further comprising:
   a buffer for capturing values of the digital output signal and/or values of a corrected digital output signal.

13. The integrated circuit of claim 11, wherein:
   the controller provides the same digital input signal during a first period and a second period; and
   the controller, during the first period, generates a first clock signal for the digital-to-analog converter which is in phase with a clock signal driving the analog-to-digital converter, and during the second period, generates a second clock signal for the digital-to-analog converter which is out of phase with the clock signal driving the analog-to-digital converter.

14. The integrated circuit of claim 13, further comprising:
   a buffer to interleave, in memory locations of the buffer, values of the digital output signal generated based on the digital input signal being injected during the first period and values of the digital output signal generated based on the same digital input signal being injected during the second period, wherein the processor estimates the coefficients based on the values stored in the buffer.

15. The integrated circuit of claim 11, wherein the processor comprises digital hardware to implement some functions of the processor.

16. The integrated circuit of claim 11, wherein the digital-to-analog converter is provided in a same electronic package as the analog-to-digital converter but not on a same semiconductor substrate as the analog-to-digital converter.

17. A method for linearizing a signal path having an analog-to-digital converter, the method comprising:
   generating, by a digital-to-analog converter on-chip with the analog-to-digital converter, a number of tonal inputs having input frequencies across a range of frequencies for injecting to the signal path;
   capturing the same number of data sets of values of a digital output signal of the signal path generated based on the tonal inputs;
   determining coefficients associated with non-idealities of the signal path based on the data sets; and
   correcting for the non-idealities of the signal path using the coefficients.

18. The method of claim 17, wherein generating the tonal inputs comprises generating one or more of: single-tone signal and multi-tone signal.

19. The method of claim 17, further comprising:
   capturing values of the digital output signal of the signal path and/or values of a corrected digital output signal in a buffer as the data sets.

20. The method of claim 17, wherein determining coefficients comprises:
   relating magnitude and phase of a fundamental and magnitude and phase of a non-linear component in each data set; and
   extracting the non-idealities of the signal path based on relationships between the fundamental and the non-linear component determined from each data set.

21. The method of claim 17, further comprising:
   disconnecting the signal path from receiving an external analog input during a calibration phase; and
   coupling an analog output of the digital-to-analog converter to the signal path during the calibration phase.

22. The method of claim 17, wherein correcting for the non-idealities comprises:
   writing coefficients to digital filters; and
   filtering, by the digital filters, the digital output signal of the analog-to-digital converter.

23. The method of claim 17, wherein correcting for the non-idealities comprises:
   tuning analog circuitry in the signal path based on the coefficients.

24. The method of claim 17, wherein determining the coefficients comprises:
   determining a correction filter based on magnitude and phase information extracted from each one of the data set.

25. The method of claim 17, wherein determining the coefficients comprises:
   applying an inverse transformation to pairs of magnitude and phase information extracted from the data sets to determine a digital filter for correcting the non-idealities.

26. A method for linearizing a signal path having an analog-to-digital converter having time-delayed interleaving, the method comprising:
   generating, by a digital-to-analog converter on-chip with the analog-to-digital converter, test signals based on a test sequence for injecting to the signal path;
   providing the same test sequence as input to the digital-to-analog converter to inject a same test signal to the signal path during a first time period and a second time period;
   clocking the digital-to-analog converter using a first clock signal during the first time period and clocking the digital-to-analog converter using a second clock signal during the second time period, wherein the first clock signal and the second clock signal have different phases with respect to a clock signal driving the analog-to-digital converter;
   capturing, in a buffer, values of a digital output signal of the signal path generated based on the same test signal being injected during the first time period and the second time period; and
   estimating non-idealities of the signal path based on the captured values in the buffer.

27. The method of claim 26, wherein capturing the values of the digital output signal comprises:
   interleaving, in memory locations of the buffer, the values of the digital output signal or data derived from the values of the digital output signal generated based on the same test signal injected to the signal path during the first time period and values of the digital output signal captured or data derived from the values of the digital output signal generated based on the same test signal injected to the signal path during the second time period.

28. The method of claim 26, wherein capturing the values of the digital output signal comprises storing values from the first time period and the second time period in interleaved memory locations in the buffer.

29. A method for linearizing a signal path, the method comprising:
- repeating, by a signal generator, a test sequence being injected into the signal path over multiple time periods;
- clocking the signal generator using clock signals shifted by different amounts for each time period;
- interleaving data captured from the signal path from the multiple time periods in a buffer; and
- determining an error of the signal path from the interleaved data.

30. The method of claim 5, wherein the test sequence is a wideband signal.

\* \* \* \* \*